US011611141B2

(12) United States Patent
Son et al.

(10) Patent No.: US 11,611,141 B2
(45) Date of Patent: Mar. 21, 2023

(54) HOUSING, MANUFACTURING METHOD THEREOF, AND ELECTRONIC DEVICE HAVING THE HOUSING

(71) Applicant: Samsung Electronics Co., Ltd., Gyeonggi-do (KR)

(72) Inventors: Kwonho Son, Gyeonggi-do (KR); Sangin Baek, Gyeonggi-do (KR); Bongsuk Choi, Seoul (KR); Gyeongtae Kim, Gyeonggi-do (KR); Minsung Lee, Gyeonggi-do (KR)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/880,637

(22) Filed: May 21, 2020

(65) Prior Publication Data

US 2020/0287275 A1   Sep. 10, 2020

Related U.S. Application Data

(63) Continuation of application No. 14/997,126, filed on Jan. 15, 2016, now Pat. No. 10,665,924.

(Continued)

(30) Foreign Application Priority Data

Apr. 29, 2015   (KR) .......................... 10-2015-0060745

(51) Int. Cl.
*H05K 5/00*   (2006.01)
*H05K 5/03*   (2006.01)
(Continued)

(52) U.S. Cl.
CPC .............. *H01Q 1/243* (2013.01); *H01Q 1/42* (2013.01); *H01Q 9/04* (2013.01); *H04M 1/0202* (2013.01);
(Continued)

(58) Field of Classification Search
CPC ............ H01Q 1/243; H01Q 1/42; H01Q 9/04; H01Q 9/42; H04M 1/0202; H05K 13/00;
(Continued)

(56) References Cited

U.S. PATENT DOCUMENTS

| 5,176,733 A | 1/1993 | Koss |
| D609,233 S | 2/2010 | Wood et al. |

(Continued)

FOREIGN PATENT DOCUMENTS

| CN | 101727234 | 6/2010 |
| CN | 102110887 | 6/2011 |

(Continued)

OTHER PUBLICATIONS

European Search Report dated May 4, 2021 issued in counterpart application No. 19155149.8-1216, 7 pages.

(Continued)

*Primary Examiner* — Anthony M Haughton
*Assistant Examiner* — Theron S Milliser
(74) *Attorney, Agent, or Firm* — The Farrell Law Firm, P.C.

(57) ABSTRACT

Disclosed is a portable electronic device including a front cover that forms a front face of the electronic device, a rear cover that forms a rear face of the electronic device, a bezel that surrounds a space formed by the front cover and the rear cover, a display device that is embedded in the space and includes a screen region that is exposed through the front cover, a metal structure that is positioned within the space and includes a first face facing the front cover and a second face facing the rear cover, a non-metal structure that is positioned within the space to partially overlap with the metal structure and includes a first surface facing the front cover and a second surface facing the rear cover, and a metal filler extending from the first surface to the second surface of the non-metal structure through a portion of the non-metal structure.

13 Claims, 20 Drawing Sheets

Related U.S. Application Data

(60) Provisional application No. 62/113,108, filed on Feb. 6, 2015.

(51) Int. Cl.
*H01Q 1/24* (2006.01)
*H05K 13/00* (2006.01)
*H04M 1/02* (2006.01)
*H01Q 1/42* (2006.01)
*H01Q 9/04* (2006.01)

(52) U.S. Cl.
CPC ............. *H05K 5/0017* (2013.01); *H05K 5/03* (2013.01); *H05K 13/00* (2013.01)

(58) Field of Classification Search
CPC ...... H05K 5/0017; H05K 5/03; H05K 5/0247; H04B 1/3888
See application file for complete search history.

(56) References Cited

U.S. PATENT DOCUMENTS

| | | | |
|---|---|---|---|
| D687,800 S | 8/2013 | Lee | |
| 8,737,045 B2 | 5/2014 | Dai | |
| 8,896,563 B2 | 11/2014 | Myers | |
| 9,047,044 B2 | 6/2015 | Raff | |
| 9,454,179 B2 | 9/2016 | Shin et al. | |
| 9,557,770 B2 | 1/2017 | Shin et al. | |
| 9,578,149 B2 | 2/2017 | Moon et al. | |
| 9,894,787 B2 * | 2/2018 | Merz ................ | H05K 5/0217 |
| 10,234,906 B2 * | 3/2019 | Myers ................ | H05K 5/02 |
| 10,411,327 B2 * | 9/2019 | Kim ................ | H01Q 1/38 |
| 11,031,717 B2 * | 6/2021 | Cho ................ | H01R 13/2435 |
| 11,056,769 B2 * | 7/2021 | Jeon ................ | H01Q 9/36 |
| 2003/0019662 A1 | 1/2003 | Higuchi et al. | |
| 2003/0103510 A1 | 6/2003 | Svanberg et al. | |
| 2006/0089171 A1 | 4/2006 | Yoo et al. | |
| 2009/0040115 A1 | 2/2009 | Zhang | |
| 2009/0256759 A1 | 10/2009 | Hill | |
| 2010/0090981 A1 | 4/2010 | Park et al. | |
| 2010/0315769 A1 | 12/2010 | Mathew | |
| 2011/0186345 A1 | 8/2011 | Pakula et al. | |
| 2011/0228494 A1 | 9/2011 | Xiao | |
| 2011/0241949 A1 | 10/2011 | Nickel | |
| 2011/0287812 A1 | 11/2011 | Joo | |
| 2012/0013510 A1 | 1/2012 | Yagi | |
| 2012/0021701 A1 | 1/2012 | Wong | |
| 2012/0044123 A1 | 2/2012 | Rothkopf | |
| 2012/0050962 A1 | 3/2012 | Hsiung | |
| 2012/0175165 A1 * | 7/2012 | Merz ................ | H05K 5/0247 174/520 |
| 2012/0178503 A1 | 7/2012 | Merz | |
| 2012/0218723 A1 | 8/2012 | Kwak et al. | |
| 2012/0229347 A1 | 9/2012 | Jin et al. | |
| 2012/0243151 A1 | 9/2012 | Lynch | |
| 2013/0250504 A1 | 9/2013 | Choi | |
| 2013/0300697 A1 | 11/2013 | Kim et al. | |
| 2013/0303092 A1 | 11/2013 | Penafiel | |
| 2013/0318766 A1 | 12/2013 | Kiple | |
| 2013/0323579 A1 | 12/2013 | Hwang | |
| 2013/0343015 A1 | 12/2013 | Malek et al. | |
| 2014/0080552 A1 | 3/2014 | Yoon et al. | |
| 2014/0085780 A1 | 3/2014 | Hsu et al. | |
| 2014/0085836 A1 | 3/2014 | Mo | |
| 2014/0091983 A1 | 4/2014 | Nakano | |
| 2014/0099527 A1 | 4/2014 | Seong et al. | |
| 2014/0104762 A1 | 4/2014 | Park | |
| 2014/0111927 A1 | 4/2014 | Raff | |
| 2014/0153211 A1 | 6/2014 | Malek | |
| 2014/0198436 A1 | 7/2014 | Lim | |
| 2014/0218878 A1 | 8/2014 | Choi et al. | |
| 2014/0228080 A1 | 8/2014 | Choi | |
| 2014/0233170 A1 | 8/2014 | Hobson | |
| 2014/0234581 A1 | 8/2014 | Immerman | |
| 2014/0267097 A1 | 9/2014 | Lee et al. | |
| 2014/0307370 A1 | 10/2014 | Zadesky et al. | |
| 2014/0311767 A1 * | 10/2014 | Merz ................ | G06F 1/1656 174/50 |
| 2014/0323063 A1 | 10/2014 | Xu | |
| 2014/0335322 A1 | 11/2014 | Luo et al. | |
| 2014/0361671 A1 | 12/2014 | Degner | |
| 2014/0367237 A1 | 12/2014 | Taylor | |
| 2014/0368228 A1 | 12/2014 | Kim | |
| 2015/0007501 A1 | 1/2015 | Liang | |
| 2015/0070236 A1 | 3/2015 | Walters | |
| 2015/0070825 A1 | 3/2015 | Perko | |
| 2015/0140291 A1 | 5/2015 | Kim | |
| 2015/0155614 A1 | 6/2015 | Youn | |
| 2016/0182112 A1 | 6/2016 | Kim | |
| 2016/0254588 A1 * | 9/2016 | Kim ................ | H01Q 1/38 343/702 |
| 2017/0041443 A1 | 2/2017 | Rostami | |
| 2017/0060182 A1 | 3/2017 | Shin et al. | |
| 2017/0322480 A1 * | 11/2017 | Kanemaki ................ | H01Q 1/38 |
| 2018/0168058 A1 * | 6/2018 | Merz ................ | H05K 5/0004 |
| 2020/0052428 A1 * | 2/2020 | Cho ................ | H01Q 1/243 |

FOREIGN PATENT DOCUMENTS

| | | |
|---|---|---|
| CN | 202262106 | 5/2012 |
| CN | 102684722 | 9/2012 |
| CN | 102710817 | 10/2012 |
| CN | 103296385 | 9/2013 |
| CN | 203260731 | 10/2013 |
| CN | 103458641 | 12/2013 |
| CN | 203386889 | 1/2014 |
| CN | 103685627 | 3/2014 |
| CN | 203466292 | 3/2014 |
| CN | 103702540 | 4/2014 |
| CN | 203589193 | 5/2014 |
| CN | 103987218 | 8/2014 |
| CN | 103987223 | 8/2014 |
| CN | 104051842 | 9/2014 |
| CN | 203895602 | 10/2014 |
| CN | 104167605 | 11/2014 |
| CN | 105376354 | 3/2016 |
| CN | 105892568 | 8/2016 |
| EP | 2 498 336 | 9/2012 |
| EP | 2 533 502 | 12/2012 |
| EP | 2 709 283 | 3/2014 |
| EP | 2 993 872 | 3/2016 |
| JP | 2014-219989 | 11/2014 |
| KR | 10-0716761 | 5/2007 |
| KR | 1020080043998 | 5/2008 |
| KR | 1020100136719 | 12/2010 |
| KR | 1020110006039 | 1/2011 |
| KR | 1020110080630 | 7/2011 |
| KR | 1020110127483 | 11/2011 |
| KR | 1020130014784 | 2/2013 |
| KR | 1020130015535 | 2/2013 |
| KR | 10-1279793 | 6/2013 |
| KR | 1020130099499 | 9/2013 |
| KR | 1020130117111 | 10/2013 |
| KR | 1020130127050 | 11/2013 |
| KR | 1020130135386 | 12/2013 |
| KR | 1020140101240 | 8/2014 |
| KR | 1020140113178 | 9/2014 |
| KR | 10-1529933 | 6/2015 |
| KR | 1020150136934 | 12/2015 |
| KR | 1020160018164 | 2/2016 |
| WO | WO 2015/001181 | 1/2015 |

OTHER PUBLICATIONS

KR Notice of Patent Grant dated Jun. 29, 2021 issued in counterpart application No. 10-2015-0063939, 5 pages.

European Search Report dated Jul. 5, 2021 issued in counterpart application No. 21176586.2-1216, 17 pages.

Thomas Halleck, "Samsung Will Release Galaxy S6 with Two Curved Edges, a Glass Back and Non-Removable Battery, Reports Say", XP055271607, Jan. 20, 2015, 7 pages.

(56) References Cited

OTHER PUBLICATIONS

Michael Maier: "MWC: Samsung teasert Galaxy S6 Edge an TechStage", XP055271738, Feb. 3, 2015, 3 pages.
Mark Prigg: "Samsung's Galaxy S6 will have Curved Screens that Cover its Sides, Daily Mail Online", XP055271817, Jan. 21, 2015, 38 pages.
International Search Report dated Apr. 27, 2016 issued in counterpart application No. PCT/KR2016/000372, 11 pages.
International Search Report dated Apr. 28, 2016 issued in counterpart application No. PCT/KR2016/000383, 12 pages.
European Search Report dated May 20, 2016 issued in counterpart application No. 16150482.4-1972, 12 pages.
European Search Report dated May 30, 2016 issued in counterpart application No. 16151140.7-1972, 9 pages.
European Search Report dated Jun. 3, 2016 issued in counterpart application No. 16150921.1-1972, 11 pages.
Notice of Allowance dated Oct. 13, 2016 issued in counterpart U.S. Appl. No. 14/994,546, 19 pages.
YouTube, "Motorola Moto X (2nd Gen): Unboxing & Review," https://www.youtube.com/watch?v=v8XJy0a4IG8, Oct. 2, 2014, 6 pages.
Ng Chong Seng, "Hands-on: Xiaomi Mi Note", http://www.hardwarezone.com.sg/feature-hands-xiaomi-mi-note, Jan. 15, 2015, 10 pages.
U.S. Office Action dated Jun. 13, 2017 issued in counterpart U.S. Appl. No. 15/017,163, 19 pages.
U.S. Office Action dated Jun. 29, 2017 issued in counterpart U.S. Appl. No. 14/996,149, 24 pages.
U.S. Office Action dated Aug. 30, 2017 issued in counterpart U.S. Appl. No. 15/402,695, 28 pages.
Chinese Office Action dated Nov. 6, 2017 issued in counterpart application No. 201610023927.6, 14 pages.
U.S. Office Action dated Jan. 17, 2018 issued in counterpart U.S. Appl. No. 14/996,149, 10 pages.
U.S. Office Action dated Nov. 17, 2017 issued in counterpart U.S. Appl. No. 15/017,163, 9 pages.
Rob Tucker, Samsung to Release New 4.99 Inch Touch Screen Phone, Jan. 19, 2013 http://tekarticles.com/article/samsung-to-release-new-4-99-inch-touch-screen-phone-906/, 2 pgs.
U.S. Office Action dated Apr. 18, 2018 issued in counterpart U.S. Appl. No. 15/402,695, 27 pages.
European Search Report dated Mar. 6, 2018 issued in counterpart application No. 17209860.0-1216, 13 pages.
Australian Examination Report dated Apr. 6, 2018 issued in counterpart application No. 2016216322, 4 pages.
Mark Prigg, "Samsung's Galaxy S6 could have curved screens that cover its sides: 'Special Edition' handset is set to take on Apple Iphone 6", Jan. 20, 2015, 38 pages.
Chinese Office Action dated May 25, 2018 issued in counterpart application No. 201610028066.0, 17 pages.
Australian Examination Report dated Jun. 7, 2018 issued in counterpart application No. 2016216322, 6 pages.
Chinese Office Action dated Jun. 21, 2018 issued in counterpart application No. 201610027955.5, 22 pages.
Chinese Office Action dated May 23, 2018 issued in counterpart application No. 201610023927.6, 9 pages.
Chinese Office Action dated Oct. 12, 2018 issued in counterpart application No. 201610023927.6, 11 pages.
Australian Examination Report dated Oct. 19, 2018 issued in counterpart application No. 2016216322, 6 pages.
European Search Report dated Nov. 2, 2018 issued in counterpart application No. 16 150 921.1-1216, 10 pages.
U.S. Office Action dated Nov. 16, 2018 issued in counterpart U.S. Appl. No. 15/402,695, 24 pages.
Chinese Office Action dated Nov. 23, 2018 issued in counterpart application No. 201610027955.5, 27 pages.
European Search Report dated May 28, 2019 issued in counterpart application No. 19155149.8-1216, 10 pages.
Australian Examination Report dated Mar. 22, 2019 issued in counterpart application No. 2016216322, 4 pages.
U.S. Office Action dated May 15, 2019 issued in counterpart U.S. Appl. No. 15/402,695, 24 pages.
Chinese Reexamination Notification dated May 22, 2019 issued in counterpart application No. 201610023927.6, 11 pages.
Chinese Office Action dated May 22, 2019 issuedin counterpart application No. 201610027955.5, 6 pages.
Chinese Reexamination Decision dated Oct. 25, 2019 issued in counterpart application No. 201610023927.6, 19 pages.
European Search Report dated Mar. 4, 2020 issued in counterpart application No. 19155149.8-1216, 9 pages.
Australian Examination Report dated Jul. 20, 2020 issued in counterpart application No. 2019204571, 7 pages.
European Search Report dated Aug. 13, 2020 issued in counterpart application No. 16150921.1216-, 9 pages.
Indian Examination Report dated Aug. 24, 2020 issued in counterpart application No. 201717028192, 7 pages.
Korean Office Action dated Jan. 4, 2021 issued in counterpart application No. 10-2015-0063939, 7 pages.
Korean Office Action dated Jan. 7, 2021 issued in counterpart application No. 10-2015-0060745, 21 pages.
Australian Examination Report dated Nov. 3, 2020 issued in counterpart application No. 2019204571, 13 pages.
AU Notice of Accceptance dated Feb. 3, 2021 issued in counterpart application No. 2019204571, 3 pages.
Nic Healey et al.., "Samsung Aims for Variety with Galaxy S6, Leaked Photo Suggests", Feb. 5, 2015, 3 pages.
"Samsung Galaxy S5 Review", YouTube, https://www.youtube.com/watch?v=IQ5TLYE3F4, Apr. 9, 2014, 3 pages.
Powerful Xiaomi New Flagship-Mi Note, YouTube, https://www.youtube.com/watch?v=pboav4GXPQ, Jan. 2015.
Korean Office Action dated Oct. 4, 2021 issued in counterpart application No. 10-2021-0119126, 10 pages.
U.S. Office Action dated Sep. 9, 2021 issued in counterpart U.S. Appl. No. 16/692,376, 56 pages.
KR Notice of Patent Grant dated Jul. 24, 2021 issued in counterpart application No. 10-2015-0060745, 13 pages.
European Search Report dated Sep. 13, 2021 issued in counterpart application No. 2019204571, 16 pages.
Dante D'Orazio, "Samsung Shows off Flexible OLED Phone Prototype (Hands-on)", The Verge, Jan. 9, 2013, 3 pages.
"Xiaomi Announces New Mi Note Phablet", https://www.gsmarena.com/xiaomi_announced_new_mi_note_phablet_with_57inch_display-news-10772.php, Jan. 15, 2015, 3 pages.
Korean Office Action dated Dec. 6, 2021 issued in counterpart application No. 10-2021-0137736, 11 pages.
U.S. Final Office Action dated Dec. 24, 2021 issued in counterpart U.S. Appl. No. 16/692,376, 23 pages.
Lets Talk About the Samsung Galaxy S Edge, https://www.pocket-lint.com/phones/news/samung/132513-let-s-talk-about-the-samsung-galaxy-s-edge, Feb. 2, 2015, 9 pages.
Korean Office Action dated Apr. 21, 2022 issued in counterpart application No. 10-2021-0119126, 16 pages.
U.S. Office Action dated May 12, 2022 issued in counterpart U.S. Appl. No. 16/692,376, 20 pages.
KR Notice of Patent Grant dated Jun. 24, 2022 issued in counterpart application No. 10-2021-0137736, 7 pages.
EP Summons to Attend Oral Proceedings dated Jul. 15, 2022 issued in counterpart application No. 19155149.8-1224, 21 pages.
Malaysian Examination Report dated Aug. 10, 2022 issued in counterpart application No. 2017702879, 2 pages.
KR Notice of Patent Grant dated Oct. 30, 2022 issued in counterpart application No. 10-2021-0119126, 5 pages.

* cited by examiner

HOUSING, MANUFACTURING METHOD THEREOF, AND ELECTRONIC DEVICE HAVING THE HOUSING

PRIORITY

This application is a Continuation Application of U.S. patent application Ser. No. 14/997,126, filed in the United States Patent and Trademark Office on Jan. 15, 2016, and claims priority under 35 U.S.C. § 119(e) to U.S. Provisional Patent Application Ser. No. 62/113,108 filed in the United States Patent and Trademark Office on Feb. 6, 2015, and under 35 U.S.C. § 119(a) to Korean Patent Application No. 10-2015-0060745 filed in the Korean Intellectual Property Office on Apr. 29, 2015, the entire contents of each of which are incorporated herein by reference.

BACKGROUND

1. Field of the Disclosure

The present disclosure relates generally to an electronic device, and more particularly to a housing, a method for manufacturing the housing, and an electronic device including the housing.

2. Description of the Related Art

As the functional differences between electronic devices of different manufacturers have recently been greatly reduced, manufacturers have gradually begun to develop slimmer electric devices in order to satisfy consumers' purchasing needs. Further, manufacturers are developing electronic devices with increased rigidity and strengthened design features in mind. As a result, various exterior structures of the electronic devices are at least partially implemented by using a metal material to provide the exterior surfaces with luxuriousness and elegance.

Further, efforts are being made to solve the problems of weakened rigidity, grounding (e.g., electric shock), deterioration of an antenna radiation performance that are caused by using the metal material on the exterior structures, etc.

An exterior structure of an electronic device, such as a housing, may be manufactured using different materials. For example, the housing may be formed by insert molding a non-metal member to a metal member and the non-metal member may be made of a synthetic resin material.

An electronic device that includes a housing having a metal member in at least a portion thereof, may require an electric connection structure between a Printed Circuit Board (PCB) arranged within the internal space of the electronic device and an electronic component generally arranged on the outer face of the electronic device (e.g., an antenna radiator). For example, in the case of the antenna radiator, a conventional antenna carrier or a Flexible PCB (FPCB) electric connection structure includes a flexible antenna radiator so that the antenna radiator can be vertically connected to a pattern face. Furthermore, the conventional antenna carrier or FPCB connection structure is flexible so that a pattern shift is enabled from a radiation face of the antenna radiator to a PCB contact face. However, a problem may occur in securing a space that is essentially needed for the pattern shift.

In the case of a Direct Print Antenna (DPA) or a Laser Direct Structuring (LDS) antenna, which is directly printed on the housing, the antenna is not able to be vertically connected to a radiation pattern so that an electric connection can be achieved using a separate metallic press-fitting pin. However, a housing structure using such a press-fitting pin requires an additional process of applying an additional component, and may cause degradation of the radiation performance of an antenna due to a deviation or an error that is caused as a result of assembly. Additionally, such housing structures generally face the following problems: an increase in manufacturing costs due to the added component; the press-fitting pins may not be able to be applied to a complicated structural portion of the housing structure, such as a curved face; and a peripheral portion, around the housing structure, may be scratched or deformed in the process of press-fitting.

In addition, a conventional screw fastening structure may present electric shock problems. For example, with a conventional screw an internal current may be transferred to an external metal housing through the screw, thereby being exposed to electric shock. In order to prevent this, a capacitor may be arranged around the screw as an electric safety device, which may also increases unit price, and a separate mounting space is needed by adopting an additional component.

SUMMARY

The present disclosure has been made to address at least the above-described problems and disadvantages, and to provide at least the advantages described below.

Accordingly, an aspect of the present disclosure is to provide a housing for an electronic device, a method for manufacturing the housing, and an electronic device including the housing.

Accordingly, another aspect of the present disclosure is to provide a housing that may implement conducting and insulating effects at a desired position merely by a process of insert molding and processing a non-metal member to a metal member.

Accordingly, another aspect of the present disclosure is to provide a housing that is implemented such that an antenna performance is maximized by securing a mounting space and a degree of freedom of the pattern of an antenna radiator.

In accordance with an aspect of the present disclosure, a portable electronic device is provided. The portable electronic device includes a front cover that forms a front face of the electronic device, a rear cover that forms a rear face of the electronic device, a bezel that surrounds a space formed by the front cover and the rear cover, a display device that is embedded in the space and includes a screen region that is exposed through the front cover, a metal structure that is positioned within the space, and includes a first face facing the front cover and a second face facing the rear cover, a non-metal structure that is positioned within the space to partially overlap with the metal structure, and includes a first surface facing the front cover and a second surface facing the rear cover, and a metal filler extending from the first surface to the second surface of the non-metal structure through a portion of the non-metal structure. The metal filler is formed of a material that is equal in strength to that of the metal structure, and includes a first end portion adjacent to the first surface and a second end portion adjacent to the second surface, and at least one of the first end portion and the second end portion are aligned to be coplanar with a portion of the first surface and a portion of the second surface, respectively.

In accordance with another aspect of the present disclosure, a portable electronic device is provided. The portable electronic device includes a front cover that forms a front face of the electronic device, a rear cover that forms a rear face of the electronic device, a bezel that surrounds a space formed by the front cover and the rear cover, a display device that is embedded in the space and includes a screen region that is exposed through the front cover, a metal structure that is positioned within the space, and includes a first face facing the front cover and a second face facing the rear cover, a non-metal structure that is positioned within the space to partially overlap with the metal structure, and includes a first surface facing the front cover and a second surface facing the rear cover; and a non-metal filler extending from the first face to the second face of the metal structure through a portion of the metal structure. The non-metal filler is formed of a material that is equal in strength to that of the non-metal structure, and includes a first end portion adjacent to the first face of the metal structure and a second end portion adjacent to the second face of the metal structure, and at least one of the first end portion and the second end portion are aligned to be coplanar with a portion of the first face of the metal structure and a portion of the second face of the metal structure, respectively.

In accordance with another aspect of the present disclosure, a method of manufacturing a portable electronic device is provided. The method includes manufacturing a structure that includes a bezel forming at least a portion of a side face of the electronic device to surround a space that is formed by a front cover and a rear cover of the electronic device, a metal structure connected to the bezel, and a non-metal structure. Manufacturing the structure includes extruding a metal plate, forming at least a portion of the metal structure on the extruded metal plate, the metal structure including at least one protrusion, forming at least a portion of the non-metal structure by insert-molding the metal plate, the non-metal structure surrounding at least a portion of the protrusion, and concurrently cutting the at least a portion of the metal structure and the at least a portion of the non-metal structure to align the metal structure and the non-metal structure such that a face of the at least one protrusion and a portion of a surface of the non-metal structure are coplanar with each other.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
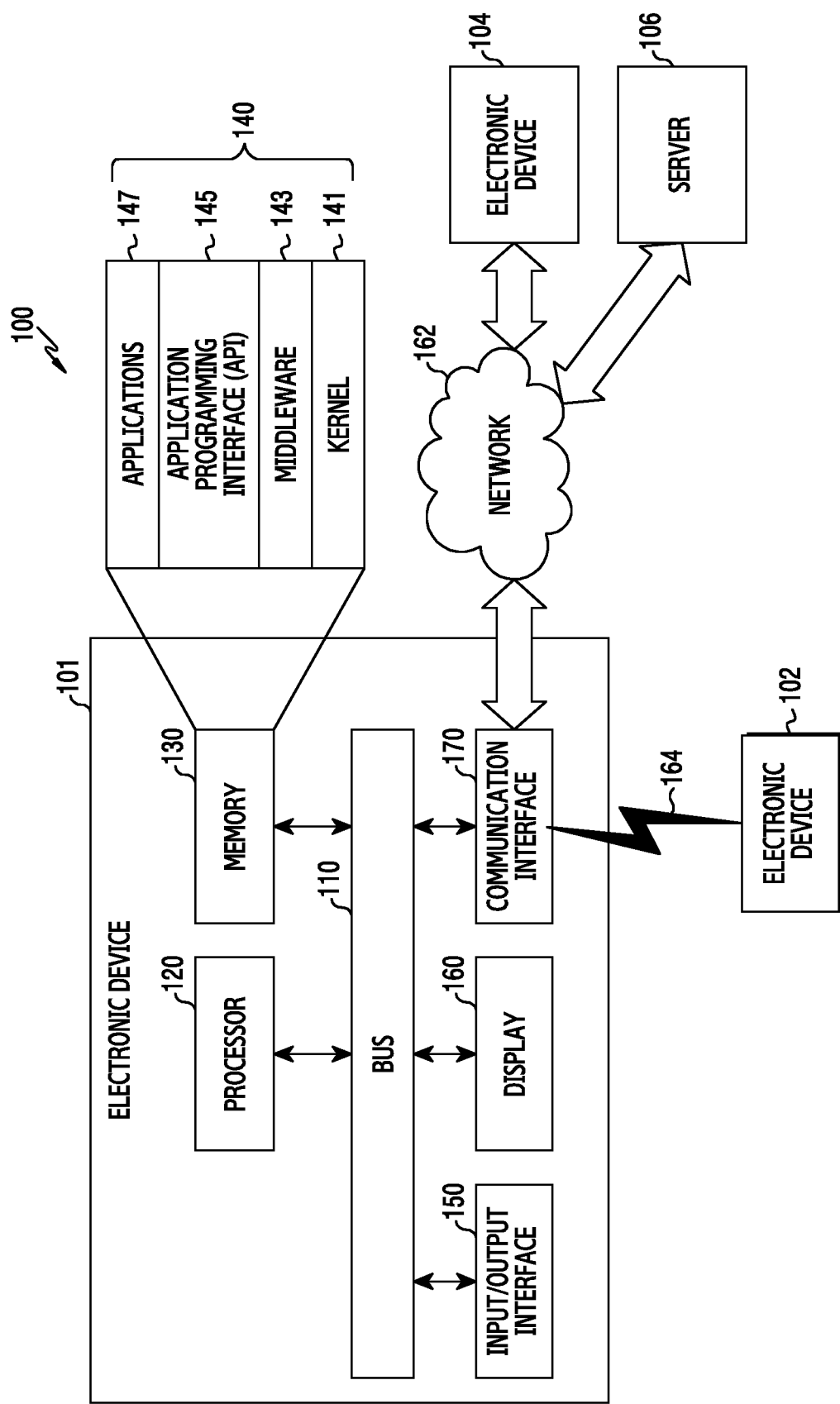
FIG. 1 is a block diagram of a configuration of a network environment including an electronic device, according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as mere examples. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness. In describing the drawings, similar reference numerals designate similar constituent elements.

The terms and words used in the following description and claims are not limited to their dictionary meanings, but are merely used to enable a clear and consistent understanding of the present disclosure. Accordingly, it should be apparent to those skilled in the art that the following description of various embodiments of the present disclosure is provided for illustration purposes only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms "have", "may have", "include", and "may include" as used herein indicate the presence of disclosed corresponding functions, operations, elements, etc., and do not limit additional one or more functions, operations, elements, etc. In addition, the terms "include" and "have" indicate the presence of features, numbers, operations, elements, parts, or a combination thereof described in the specifications, and do not preclude the presence or addition of one or more other features, numbers, operations, elements, parts, or a combination thereof.

The terms "A or B", "at least one of A or/and B" and "one or more of A or/and B" as used herein include any and all combinations of words enumerated with it. For example, "A or B", "at least one of A and B" or "at least one of A or B" describes (1) including A, (2) including B, or (3) including both A and B.

Although terms, such as "first" and "second" as used herein may modify various elements, these terms do not limit the corresponding elements. For example, these terms do not limit an order and/or importance of the corresponding elements. These terms may be used for the purpose of distinguishing one element from another element. For example, a first user device and a second user device both indicate user devices and may indicate different user devices. For example, a first element may be referred to as a second element without departing from the scope of the present disclosure, and similarly, a second element may be referred to as a first element.

When an element (e.g., a first element) is "connected to" or (operatively or communicatively) "coupled with/to" another element (e.g., a second element), the first element may be directly connected or coupled to the second element, and there may be an intervening element (e.g., a third element) between the first element and the second element. To the contrary, when an element (e.g., the first element) is "directly connected" or "directly coupled" to another element (e.g., the second element), there is no intervening element (e.g., the third element) between the first element and the second element.

The expressions "configured to" and "set to" as used herein may be replaced with "suitable for", "having the capacity to", "designed to", "adapted to", "made to", or "capable of" according to the situation. The term "configured/set to" does not necessarily indicate "specifically designed to" in a hardware level. Instead, the expression "apparatus configured to . . . " may indicate that the apparatus is "capable of . . . " along with other devices or parts in a certain situation. For example, "a processor configured/set to perform A, B, and C" may be a dedicated processor, e.g., an embedded processor, for performing a corresponding operation, or a generic-purpose processor, e.g., a central processing unit (CPU) or an application processor (AP), capable of performing a corresponding operation by executing one or more software programs stored in a memory device.

The terms as used herein merely describe certain embodiments of the present disclosure and are not intended to limit the present disclosure. Further, all the terms used herein, including technical and scientific terms, should be interpreted to have the same meanings as commonly understood by those skilled in the art to which the present disclosure pertains, and should not be interpreted to have ideal or excessively formal meanings, unless explicitly defined herein.

A module or programming module, according to various embodiments of the present disclosure, may further include at least one or more of the aforementioned constituent elements, may omit some of them, or may further include additional constituent elements. Operations performed by a module, programming module, or other constituent elements may be executed in a sequential, parallel, repetitive, or heuristic manner. In addition, some of the operations may be executed in a different order or may be omitted, or other operations may be added.

An electronic device, according to various embodiments of the present disclosure, may include at least one of a smart phone, a tablet personal computer (PC), a mobile phone, a video phone, an e-book reader, a desktop PC, a laptop PC, a netbook computer, a workstation, a server, a personal digital assistant (PDA), a portable multimedia player (PMP), a moving picture experts group phase 1 or phase 2 (MPEG-1 or MPEG-2) audio layer 3 (MP3) player, a mobile medical device, a camera, or a wearable device (e.g., a head-mounted-device (HMD), electronic glasses, electronic clothing, an electronic bracelet, an electronic necklace, an electronic appcessory, an electronic tattoo, a smart mirror, a smart watch, etc.).

An electronic device may also be a smart home appliance. For example, smart home appliances may include at least one of a television (TV), a digital versatile disc (DVD) player, an audio component, a refrigerator, an air conditioner, a vacuum cleaner, an oven, a microwave oven, a washing machine, an air cleaner, a set-top box, a home automation control panel, a security control panel, a TV box (e.g., Samsung HomeSync®, Apple TV®, or Google TV®), a game console (e.g., Xbox® PlayStation®), an electronic dictionary, an electronic key, a camcorder, an electronic frame, etc.

An electronic device may also include at least one of a medical equipment (e.g., a mobile medical device (e.g., a blood glucose monitoring device, a heart rate monitor, a blood pressure monitoring device, a temperature meter, etc.), a magnetic resonance angiography (MRA) machine, a magnetic resonance imaging (MRI) machine, a computed tomography (CT) scanner, an ultrasound machine, etc.), a navigation device, a global positioning system (GPS) receiver, an event data recorder (EDR), a flight data recorder (FDR), an in-vehicle infotainment device, electronic equipment for a ship (e.g., ship navigation equipment and/or a gyrocompass), avionics equipment, security equipment, a head unit for a vehicle, an industrial or home robot, an automatic teller machine (ATM), a point of sale (POS) device, or an Internet of Things (IoT) device (e.g., a light bulb, various sensors, an electronic meter, a gas meter, a sprinkler, a fire alarm, a thermostat, a streetlamp, a toaster, sporting equipment, a hot-water tank, a heater, a boiler, etc.)

An electronic device may also include at least one of a piece of furniture or a building/structure, an electronic board, an electronic signature receiving device, a projector, and various measuring instruments (e.g., a water meter, an electricity meter, a gas meter, a wave meter, etc.).

An electronic device may also include a combination of one or more of the above-mentioned devices.

Further, it will be apparent to those skilled in the art that an electronic device is not limited to the above-mentioned examples.

Herein, the term "user" may indicate a person who uses an electronic device or a device (e.g., an artificial intelligence electronic device) that uses the electronic device.

An electronic device of a single radio environment can provide long-term evolution (LTE) service using circuit switched fall back (CSFB) which determines whether paging information of a circuit switched (CS) service network is received over an LTE network. When receiving a paging signal of the CS service network over the LTE network, the electronic device connects (or accesses) the CS service network (e.g., a 2nd generation (2G)/3rd generation (3G)

network) and provides a voice call service. For example, the 2G network can include one or more of a global system for mobile communications (GSM) network and a code division multiple access (CDMA) network. The 3G network can include one or more of a wideband-CDMA (WCDMA) network, a time division-synchronous CDMA (TD-SCDMA) network, and an evolution-data optimized (EV-DO) network.

Alternatively, the electronic device of the single radio environment can provide LTE service using single radio LTE (SRLTE) which determines whether the paging information is received by periodically switching every radio resource (e.g., receive antennas) to the CS service network (e.g., the 2G/3G network). Upon receiving the paging signal of the CS service network, the electronic device provides the voice call service by connecting the CS service network (e.g., the 2G/3G network).

Alternatively, the electronic device of the single radio environment can provide LTE service using single radio dual system (SRDS) which determines whether the paging information is received by periodically switching some of radio resources (e.g., receive antennas) to the CS service network (e.g., the 2G/3G network). Upon receiving the paging signal of the CS service network, the electronic device provides the voice call service by connecting the CS service network (e.g., the 2G/3G network).

FIG. 1 is a block diagram of a configuration of a network environment including an electronic device, according to an embodiment of the present disclosure.

Referring to FIG. 1, an electronic device 101 in a network environment 100 is provided. The electronic device 101 includes a bus 110, a processor 120, a memory 130, an input/output interface 150, a display 160, and a communication interface 170. The electronic device 101 can omit at least one of the components or further include another component.

The bus 110 is a circuit for connecting the components of the electronic device 101 (e.g., the processor 120, the memory 130, the input/output interface 150, the display 160, and the communication interface 170) and delivering communications (e.g., a control message) therebetween.

The processor 120 includes one or more of a CPU, an AP, and a communication processor (CP). The processor 120 processes an operation or data on control of and/or communication with another component of the electronic device 101.

The processor 120, which is connected to the LTE network, determines whether a call is connected over the CS service network using caller identification information (e.g., a caller phone number) of the CS service network (e.g., the 2G/3G network). For example, the processor 120 receives incoming call information (e.g., a CS notification message or a paging request message) of the CS service network over the LTE network (e.g., CSFB). Alternatively, the processor 120, being connected to the LTE network, receives incoming call information (e.g., a paging request message) over the CS service network (e.g., SRLTE).

When receiving the incoming call information (e.g., a CS notification message or a paging request message) of the CS service network over the LTE network, the processor 120 obtains caller identification information from the incoming call information. The processor 120 displays the caller identification information on its display 160. The processor 120 determines whether to connect the call based on input information corresponding to the caller identification information displayed on the display 160. For example, when detecting input information corresponding to an incoming call rejection, through the input/output interface 150, the processor 120 restricts the voice call connection and maintains the LTE network connection. For example, when detecting input information corresponding to an incoming call acceptance, through the input/output interface 150, the processor 120 connects the voice call by connecting to the CS service network.

When receiving the incoming call information (e.g., a CS notification message or a paging request message) of the CS service network over the LTE network, the processor 120 obtains caller identification information from the incoming call information. The processor 120 determines whether to connect the call by comparing the caller identification information with a reception control list. For example, when the caller identification information is included in a first reception control list (e.g., a blacklist), the processor 120 restricts the voice call connection and maintains the connection to the LTE network. When the caller identification information is not included in the first reception control list (e.g., the blacklist), the processor 120 connects the voice call by connecting to the CS service network. When the caller identification information is included in a second reception control list (e.g., a white list), the processor 120 connects the voice call by connecting to the CS service network.

When receiving the incoming call information (e.g., a paging request message) of the CS service network over the LTE network, the processor 120 transmits an incoming call response message (e.g., a paging response message) to the CS service network. The processor 120 suspends the LTE service and receives the caller identification information (e.g., a CS call (CC) setup message) from the CS service network. The processor 120 determines whether to connect the call by comparing the caller identification information with the reception control list. For example, when the caller identification information is included in the first reception control list (e.g., the blacklist), the processor 120 restricts the voice call connection and resumes the LTE network connection. When the caller identification information is not included in the first reception control list (e.g., the blacklist), the processor 120 connects the voice call by connecting to the CS service network. When the caller identification information is included in the second reception control list (e.g., the white list), the processor 120 connects the voice call by connecting to the CS service network.

The memory 130 includes volatile and/or nonvolatile memory. The memory 130 stores commands or data (e.g., the reception control list) relating to at least one of the other components of the electronic device 101. The memory 130 may store software and/or a program 140. The program 140 may include, for example, a kernel 141, middleware 143, an application programming interface (API) 145, applications 147. At least some of the kernel 141, the middleware 143, and the API 145 may be referred to as an operating system (OS).

The kernel 141 controls or manages system resources (e.g., the bus 110, the processor 120, or the memory 130) used for performing an operation or function implemented by the other programs (e.g., the middleware 143, the API 145, or the applications 147). Furthermore, the kernel 141 provides an interface through which the middleware 143, the API 145, or the applications 147 connects the individual elements of the electronic device 101 to control or manage the system resources.

The middleware 143 functions as an intermediary for allowing the API 145 or the applications 147 to communicate with the kernel 141 to exchange data.

In addition, the middleware 143 processes one or more task requests received from the applications 147 according to priorities thereof. For example, the middleware 143 assigns priorities for using the system resources (e.g., the bus 110, the processor 120, the memory 130, etc.) of the electronic device 101, to at least one of the applications 147. For example, the middleware 143 may perform scheduling or load balancing on the one or more task requests by processing the one or more task requests according to the priorities assigned thereto.

The API 145 is an interface through which the applications 147 control functions provided from the kernel 141 or the middleware 143, and may include at least one interface or function (e.g., an instruction) for file control, window control, image processing, text control, etc.

The input/output interface 150 functions as an interface that transfers instructions or data input from a user or another external device to the other element(s) of the electronic device 101. Furthermore, the input/output interface 150 outputs the instructions or data received from the other element(s) of the electronic device 101 to the user or an external electronic device, such as a first external electronic device 102, a second external electronic device 104, or a server 106.

The display 160 may include a liquid crystal display (LCD), a light emitting diode (LED) display, an organic LED (OLED) display, a micro electro mechanical system (MEMS) display, an electronic paper display, etc. The display 160 displays various types of content (e.g., a text, images, videos, icons, symbols, etc.) for the user. The display 160 may include a touch screen and receive, for example, a touch, a gesture, proximity, a hovering input, etc., using an electronic pen or the user's body part. The display 160 may display a web page.

The communication interface 170 establishes a communication between the electronic device 101 and the first external electronic device 102, the second external electronic device 104, or the server 106. For example, the communication interface 170 communicates with the first external electronic device 102 through a wireless communication or a wired communication 164, and also communicates with the second external electronic device 104 or the server 106 in connection to a network 162 through wireless communication or wired communication.

The wireless communication can conform to a cellular communication protocol including at least one of LTE, LTE-advanced (LTE-A), CDMA, WCDMA, universal mobile telecommunications system (UMTS), wireless broadband (WiBro), and GSM.

The wired communication can include at least one of universal serial bus (USB), high definition multimedia interface (HDMI), recommended standard 232 (RS-232), and plain old telephone service (POTS).

The network 162 can include at least one of telecommunications networks, for example, a computer network (e.g., a local area network (LAN) or a wide area network (WAN)), the Internet, a telephone network, etc.

The electronic device 101 provides the LTE service in the single radio environment by use of at least one module functionally or physically separated from the processor 120.

Each of the first external electronic device 102 and the second external electronic device 104 may be a type of device that is the same as or different from the electronic device 101. The server 106 may include a group of one or more servers.

All or some of the operations to be executed by the electronic device 101 may be executed by another electronic device or a plurality of other electronic devices, such as the first external electronic device 102, the second external electronic device 104, or the server 106. In the case where the electronic device 101 should perform a certain function or service automatically or by request, the electronic device 101 may request some functions that are associated therewith from the first external electronic device 102, the second external electronic device 104 or the server 106 instead of or in addition to executing the function or service by itself. The first external electronic device 102, the second external electronic device 104, or the server 106 may execute the requested functions or additional functions, and may transmit the results to the electronic device 101. The electronic device 101 may provide the requested functions or services by processing the received results as they are or additionally. For this purpose, for example, a cloud computing technique, a distributed computing technique, or a client-server computing technique may be used.

Various embodiments of the present disclosure will be described with reference to a display 160 that includes a bent or curved area and is applied to a housing of the electronic device 101, in which a non-metal member and a metal member (e.g., a metal bezel) are formed through dual injection molding, but are not limited thereto. For example, the display 160 may be applied to a housing, in which a metal member or a non-metal member is formed of a single material.

Figure 2A:
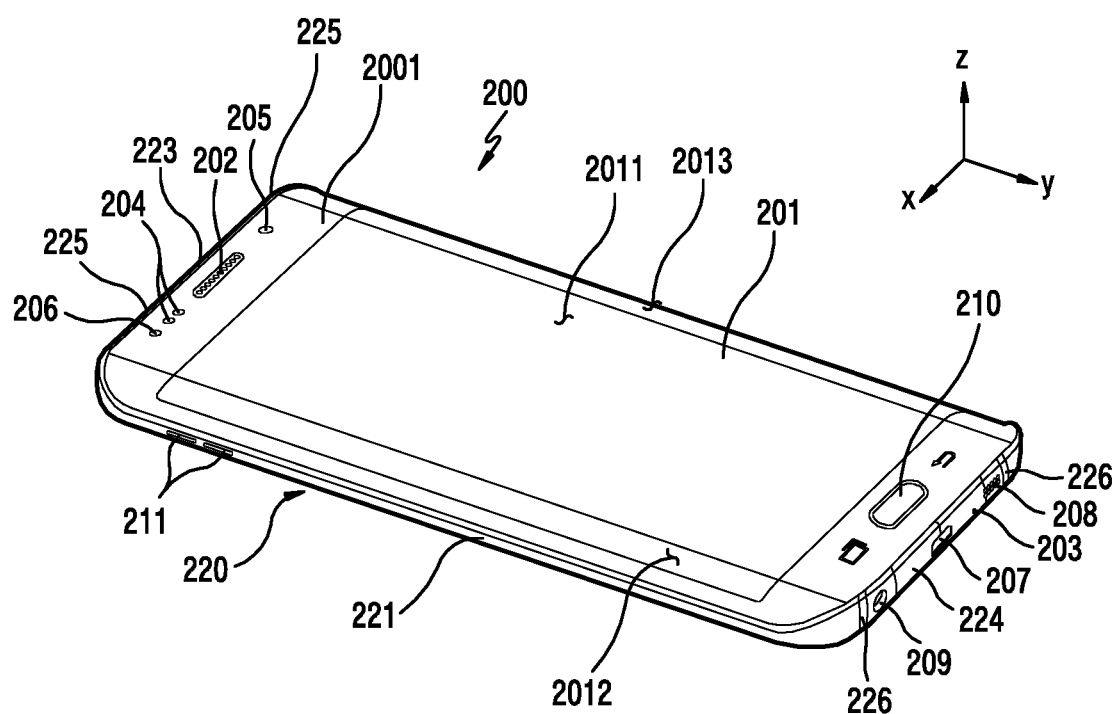
FIG. 2A is a front perspective view of an electronic device, according to an embodiment of the present disclosure.
Figure 2B:
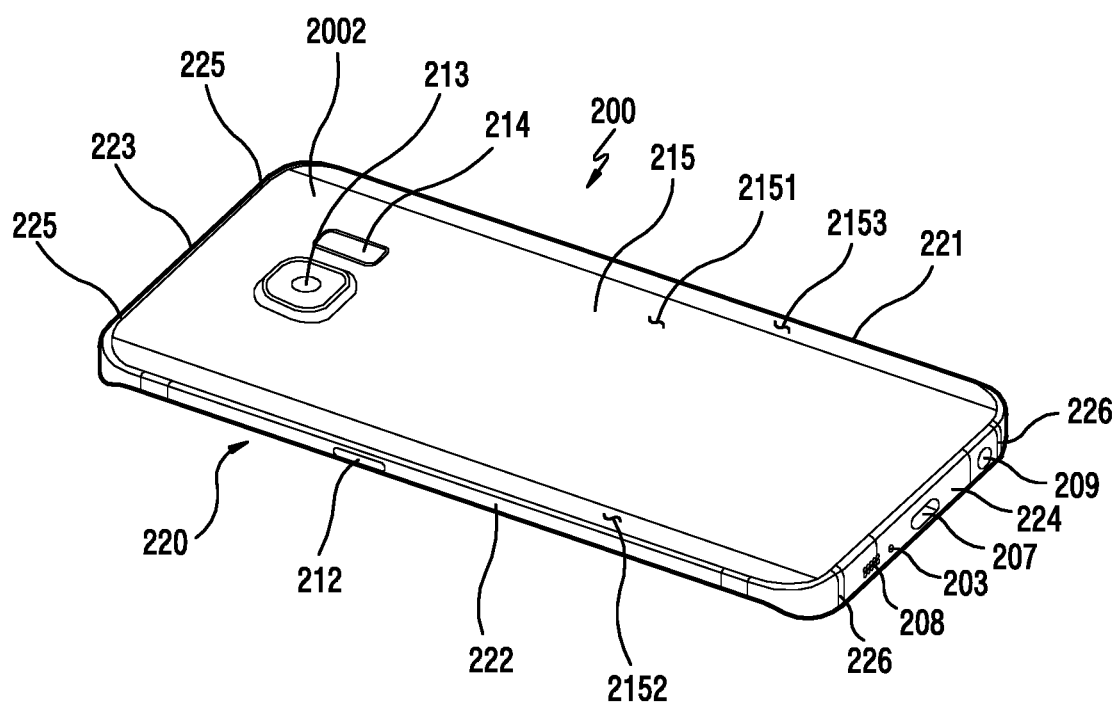
FIG. 2B is a rear perspective view of an electronic device according to an embodiment of the present disclosure.
Figure 2C:
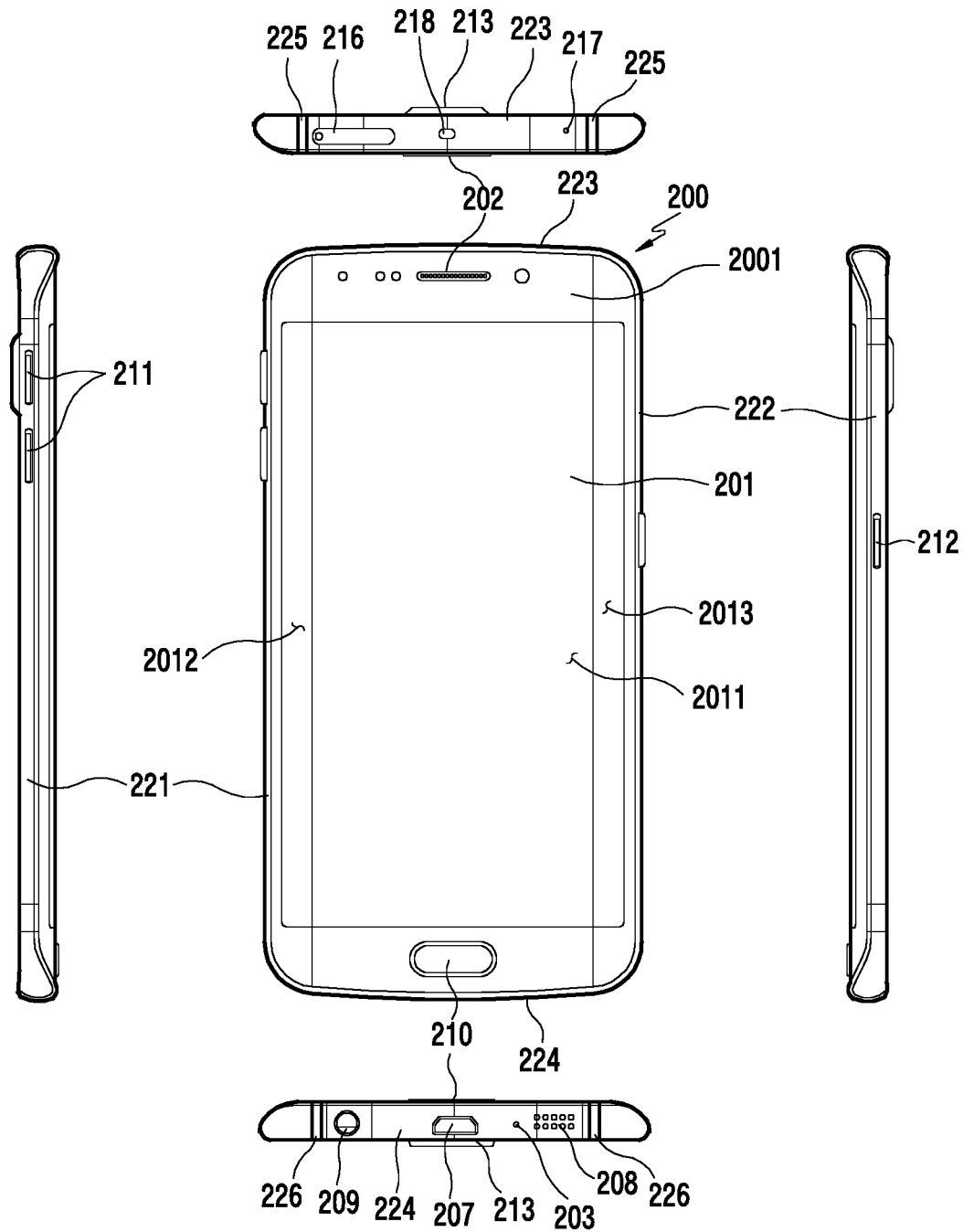
FIG. 2C are various views of an electronic device, according to an embodiment of the present disclosure.

FIG. 2A is a front perspective view of an electronic device, according to an embodiment of the present disclosure. FIG. 2B is a rear perspective view of an electronic device, according to an embodiment of the present disclosure. FIG. 2C are various views of an electronic device, according to an embodiment of the present disclosure.

Referring to FIGS. 2A to 2C, a display 201 is installed on a front surface 2001 of an electronic device 200. A receiver 202 for receiving a voice of a caller is disposed at an upper area of the display 201. Components for performing various functions of the electronic device 200 are disposed around the receiver 202 on an upper area of the display 201. The components include at least one sensor module 204, a front camera device 205, and an indicator 206. The sensor module 204 may include, for example, an illuminance sensor (e.g., an optical sensor), a proximity sensor (e.g., an optical sensor), an infrared sensor, an ultrasonic sensor, etc. The front camera device 205 is for taking still or moving pictures. The indicator 206 is to inform the user of state information of the electronic device 200.

The electronic device 200 includes a metal bezel 220 as a metal housing. The metal bezel 220 is disposed along the outer periphery of the electronic device 200 and may extend to at least a part of the rear surface of the electronic device 200, which is continuous to the outer periphery. The metal bezel 220 defines at least a part of the thickness of the electronic device 200 along the outer periphery of the electronic device 200, and may be formed in a closed loop shape. Without being limited thereto, however, the metal bezel 220 may be formed in a manner that contributes to at least a part of the thickness of the electronic device 200. The metal bezel 220 may only be disposed on a part of the outer periphery of the electronic device 200. When the metal bezel 220 contributes to a part of the housing of the electronic device 200, a non-metal material may contribute to the remaining portion of the housing. In such a case, the housing is formed in a manner of insert-molding the non-metal member to the metal bezel 220.

The metal bezel 220 may include one or more cut-off portions 225 and 226 so that a unit bezel portion between the cut-off portions 225 and 226 may be utilized as an antenna radiator. An upper bezel portion 223 is a unit bezel portion bounded by one pair of cut-off portions 225 that are formed at a certain interval. A lower bezel portion 224 is a unit bezel portion bounded by one pair of cut-off portions 226 that are formed at a certain interval. The cut-off portions 225 and 226 may be formed when the non-metal member is insert-molded to the metal member.

The metal bezel 220 includes a left bezel portion 221, a right bezel portion 222, the upper bezel portion 223, and the lower bezel portion 224, as viewed from the front side of the electronic device 200.

Various components are disposed on the lower bezel portion 224 of the electronic device 200, such as a microphone device 203, an interface connector port 207, a speaker 208, and an ear jack hole 209. The microphone device 203 is for transmitting a voice of a user of the electronic device 200 to a caller. The interface connector port 207 is disposed adjacent to the microphone device 203 on one side. The interface connector port 207 performs a data transmission/reception function with respect to an external device and is used for charging the electronic device 200 by receiving an external power applied thereto. The speaker device 208 is disposed adjacent to the microphone device on 203 on the other side. The ear jack hole 209 is disposed adjacent to the interface connector port 207. The microphone device 203, the speaker device 208, the interface connector port 207, and the ear jack hole 209 are all disposed within the area of the unit bezel portion that is formed between one pair of cut-of portions 226 disposed in the lower bezel portion 224. Without being limited thereto, however, at least one of the above-described electronic components may be disposed in the area that includes the cut-off portion 226, or may be disposed outside the unit bezel portion.

Various electronic components may also be disposed on the upper bezel portion 223 of the electronic device 200, such as a socket device 216, an auxiliary microphone device 217, and an infrared sensor module 218. The socket device 216 is for insertion of a card-type external device. The socket device 216 may accommodate at least one of an inherent identification (ID) card for the electronic device 200 (e.g., a subscriber identity module (SIM) card or a user identity module (UIM)), and a memory card for extending a storage space. The infrared sensor module 218 is disposed adjacent to the socket device 216 and the auxiliary microphone device 217 is disposed adjacent to the infrared sensor module 218. The socket device 216, the infrared sensor module 218, and the auxiliary microphone device 217 are disposed within the area of the unit bezel portion formed between one pair of cut-off portions 225 that are disposed in the upper bezel portion 223. Without being limited thereto, however, at least one of the above-mentioned electronic components may be disposed in the area that includes of the cut-off portion 225, or may disposed outside the cut-off portion.

One or more first side key buttons 211 are disposed on the left bezel portion 221 of the metal bezel 220. The first side key buttons 211 partially protrude and are configured to perform a volume up/down function, a scroll function, etc. At least one second side key button 212 is disposed on the right bezel portion 222 of the metal bezel 220. The second side key button 212 is configured to perform a power ON/OFF function, a wake-up/sleep function, etc.

At least one key button 210 is disposed in a lower area of the display 201. A fingerprint recognition sensor device may be disposed on the top surface of the key button 210. The key button 210 may be configured to perform a first function, such as a home screen return function, a wake-up/sleep function, etc., by physically pressing the key button 210, and to perform a second function, such as a fingerprint recognition function, by swiping the top surface of the key button 210. Touch pads may be disposed on the left and right of the key button 210 so as to perform a touch function.

A rear camera device 213 is disposed on the rear surface 2002 of the electronic device 200, and one or more electronic components 214 is disposed adjacent to the rear camera device 213. The electronic components 214 may include at least one of an illuminance sensor (e.g., an optical sensor), a proximity sensor (e.g., an optical sensor), an infrared sensor, an ultrasonic sensor, a heart rate sensor, a flash device, etc.

The front surface 2001, in which the display 201 is provided, includes a planar portion 2011, and a left bent portion 2012 and a right bent portion 2013 which are formed on the left and right of the planar portion 2011, respectively. The front surface 2001 of the electronic device 200 includes the display area 201 and other areas (e.g., a black matrix (BM) area) by using a single window. The left and right bent portions 2012 and 2013 are formed to extend in an x-axis direction of the electronic device 200 from the planar portion 2011, as shown in FIG. 2A. Each of the left and right bent portions 2012 and 2013 may be configured as a part of the side surfaces of the electronic device 200. In such a case, the left and right bent portions 2012 and 2013 may be configured as the side surfaces of the electronic device 200 together with the left and right bezel portions 221 and 222 of the metal bezel 220, respectively. Without being limited thereto, however, the front surface 2001, in which the display 201 is provided, may include only one of the left and right bent portions 2012 and 2013. That is, the front surface 2001 may be configured to include only the left bent portion 2012 along the planar portion 2011, or to include only the right bent portion 2013 along the planar portion 2011.

The front surface 2001 may include a flexible display module that is applied to at least a portion of the window that includes the bent portions 2012 and 2013 on the left and right thereof, and the lower side of the window. The area including the flexible display module may be configured as the display 201. The window may be formed in a manner in which the top and rear surfaces thereof are simultaneously bent (hereinafter, a "three-dimensional (3D) type"). Without being limited thereto, the window may be formed in a manner in which the left and right portions of the top surface are formed in a curved shape and the rear surface is formed in a planar shape (hereinafter, "two-and-a-half dimensional (2.5D) type"). The window may be formed of a transparent glass material (e.g., a sapphire glass) or a transparent synthetic resin material.

The electronic device 200 may control the display module so as to selectively display information. Further, the electronic device 200 may control the display module so as to configure a screen only on the planar portion 2011, to configure a screen by any one of the left and right bent portions 2012 and 2013 together with the planar portion 2011 or to configure a screen by at least one of the left and right bent portions 2012 and 2013, excluding the planar portion 2011.

The rear surface 2002 of the electronic device 200 may also be entirely formed by one window 215. The rear surface 2002 includes a planar portion 2151 that is substantially formed in a central portion to be the center, and a left bent portion 2152 and a right bent portion 2153, which are formed on the left and right of the planar portion 2151, respectively. The window 215 is configured in the 2.5D type in which the left and right bent portions 2152 and 2153 of the outer surface are formed in a curved shape and the rear surface is formed as a planar surface. Without being limited thereto, however, the window 215 may be formed in the 3D type, similar to the window disposed on the front surface 2001. Each of the left and right bent portions 2152 and 2153 may be configured as a part of the side surfaces of the electronic device 200. In such a case, the left and right bent portion 2152 and 2153 may be configured as the side surfaces of the electronic device 200 together with the left and right bezel portions 221, 222 of the metal bezel 220. Without being limited thereto, however, the rear surface 2002 may include only at least one of the left and right bent portions 2152 and 2153. The rear surface 2002 may be configured to include only the left bent portion 2152 along the planar portion 2151, or to include only the right bent portion 2153 along the planar portion 2151.

The upper side left and right corner portions and the lower side left and right corner portions of the front surface 2001 may be formed to be simultaneously inclined in the x-axis direction, the y-axis direction, and the z-axis direction while the window is bent, as shown in FIGS. 2A and 2C. With this shape, the upper side left and right corner portions and the lower side left and right corner portions of the metal bezel 220 may be formed such that the heights thereof gradually decrease towards their respective side surfaces.

While a metal bezel 220, which is configured as a part of the housing of the electronic device 200, has been illustrated and described above, various embodiments of the present disclosure are not limited thereto. For example, various metal members disposed on the electronic device 200 may be used for various embodiments of the present disclosure.

Figure 3:
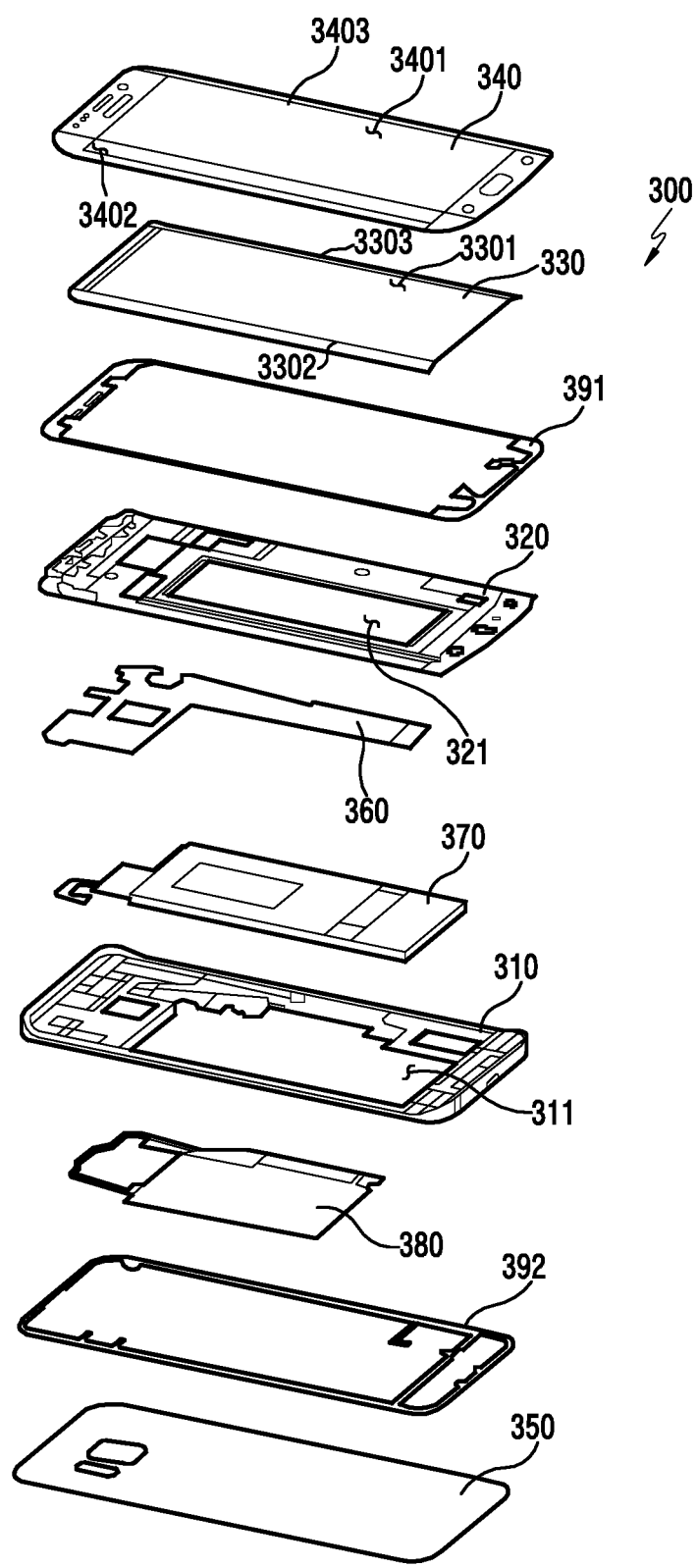
FIG. 3 is an exploded perspective view of an electronic device in a disassembled state, according to an embodiment of the present disclosure.

FIG. 3 is an exploded perspective view of an electronic device in a disassembled state, according to an embodiment of the present disclosure. Referring to FIG. 3, an electronic device 300 is provided. The electronic device 300 may be the same as the above-described electronic device 200. The electronic device 300 includes a printed circuit board (PCB) 360, a bracket 320, a display module 330, and a front window 340, which are disposed in a manner of being sequentially staked on the upper side of the housing 310. The electronic device includes a wireless power transmission/reception member 380 and a rear window 350, which are disposed in a manner of being sequentially staked on the lower side of the housing 310. A battery pack 370 is accommodated in an accommodation space 311, which is formed in the housing 310, and is disposed to avoid the PCB 360. The battery pack 370 and the PCB 360 are disposed in parallel not to overlap with each other. The display module 330 is fixed to the bracket 320, and the front window 340 is fixed by being attached to the bracket 320 by a first adhesive member 391. The rear window 350 is fixed by being attached to the housing 310 by a second adhesive member 392.

According to various embodiments of the present disclosure, the front window 340 includes a planar portion 3401, a left bent portion 3402, and a right bent portion 3403, which are bent in opposite directions from the planar portion 3401. The front window 340 is positioned on the electronic device 300 so as to form the front surface, and is formed of a transparent material so as to display a screen presented by the display module 330 and to provide an input/output window for various sensors. While a shape in which the left and right bent portions 3402 and 3403 are formed in the 3D type is illustrated, a shape in which upper and lower portions of the window, as well as the left and right bent portions 3402 and 3403, are single-bent, or a shape in which the upper and lower portions and the left, and right bent portions 3402 and 3403 are dual-bent, may be applied. A touch panel may be further disposed on the rear surface of the front window 340 and may receive a touch input signal from the outside.

The display module 330 may also be formed in a shape corresponding to that of the front window 340 (a shape having a curvature corresponding to that of the front window 340). In this case, the display module 330 includes a planar portion 3301, and left and right bent portions 3302 and 3303 on the left and right of the planar portion 3301. A flexible display module may be used as the display module 330. In the case of a window in a type where the rear surface of the front window 340 is formed in a planar shape (hereinafter, 2D type or 2.5 D type), since the rear surface of the front window 340 is planar, an ordinary LCD or an on-cell touch screen panel (TSP) active matrix OLED (AMOLED) (OCTA) may be applied.

The first adhesive member 391 is a component for fixing the front window 340 to a bracket 320 that is disposed within the electronic device 300, and may be a kind of tape, such as a double-sided tape, or a liquid adhesive layer, such as a bond. When the double-sided tape is applied as the first adhesive member 391, a general polyethylene terephthalate (PET), or a functional base may be applied as the internal base of the adhesive member 391. For example, by using a base formed of a foam type or shock-resistive fabric material, so as to reinforce the shock resistance, it is possible to prevent the front window 340 from being destroyed by external impact.

By being disposed within the electronic device 300, the bracket 320 is a component used for reinforcing the entire rigidity of the electronic device 300. The bracket 320 may be formed of at least one metal selected from aluminum (Al), magnesium (Mg), and STS. The bracket 320 may be formed of a highly rigid plastic, in which glass fibers are contained, or may be formed of a combination of a metal and a plastic. When a metal member and a non-metal member are used in combination, the bracket 320 is formed by insert-molding the non-metal member to the metal member. The bracket 320 is placed on the rear surface of the display module 330. The bracket 320 has a shape (curvature) that is similar to the shape of the rear surface of the display module 330 and supports the display module 330. Between the bracket 320 and the display module 330, an elastic member, such as a sponge or a rubber, and the first adhesive member 391, such as a liquid adhesive, a double-sided tape, or a kind of sheet, such as a single-sided tape, may be additionally disposed so as to protect the display module 330. A section of the bracket 320 further includes a slot-sinking or hole area 321 for securing a component mounting space or a marginal space based on a change of a component during use, such as the swelling of the battery pack 370. As necessary, a sheet-type meal or composite material may be added to the corresponding hole area 321 so as to reinforce the internal rigidity, or an auxiliary device for improving a thermal characteristic, an antenna characteristic, etc., may be further provided in the hole area 321. The bracket 320 is fastened to the housing 310 (e.g., the rear case) so as to form a space therein, and at least one electronic component may be disposed in such a space. The at least one electronic component may include the PCB 360. Without being limited thereto, however, the at least one electronic component may include an antenna device, a sound device, a power supply device, a sensor device, etc., in addition to the PCB 360.

The battery pack 370 supplies power to the electronic device 300. One surface of the battery pack 370 is positioned close to the display module 330 and the other surface is positioned close to the rear window 350, so that if the battery pack 370 swells during charge, adjacent components may be deformed or destroyed. In order to prevent this, a the hole area 321, as described above, is provided between the battery pack 370 and the adjacent components (e.g., the display module 330 and the rear window 350) so as to protect the adjacent components. The battery pack 370 may be integrated with the electronic device 300. Without being limited thereto, however, when the rear window 350 is implemented to be attachable to/detachable from the electronic device 300, the battery pack 370 may be implemented to be attachable/detachable.

The housing 310 forms the exterior of the electronic device 300 (e.g., side surfaces including a metal bezel), and is coupled to the bracket 320 so as to form an internal space. The front window 340 is disposed on the front surface of the housing 310, and the rear window 350 is disposed on the rear surface of the housing 310. Without being limited thereto, however, the rear surface of the housing 310 may be variously implemented by molding a synthetic resin, or by using a metal, a composite of a metal and a synthetic resin, etc. An inter-structure gap formed by the housing 310 and the rear window 350 prevents the destruction of the rear window 350 from a secondary impact by an internal structure when an external impact occurs, such as a drop of the electronic device 300.

The wireless power transmission/reception member 380 is disposed on the rear surface of the housing 310. The wireless power transmission/reception member 380 has a thin film form and is disposed by being attached to one surface of an internally mounted component or an area of the inner surface of the housing 310, in particular to an area that is generally close to the rear window 350. The wireless power transmission/reception member 380 includes a structure that forms a contact with the PCB 360 within the housing 310. The wireless power transmission/reception member 380 may be embedded or attached as a component of the battery pack 370, etc., or a part of the housing 310, and may be provided in the form of being attached to both of a component and the housing 310.

The second adhesive member 392 is a component that fixes the rear window 350 to the housing 310 and may be applied in a form similar to that of the first adhesive member 391 described above.

The rear window 350 may be applied in a form similar to that of the front window 340. The front surface (the surface exposed to the outside) of the rear window 350 is formed in a curvature that is more inclined in the direction of the left and right ends. The rear surface of the rear window 350 is formed in a planar surface to be attached to the hosing 310 by the second adhesive member 392.

Figure 4A:
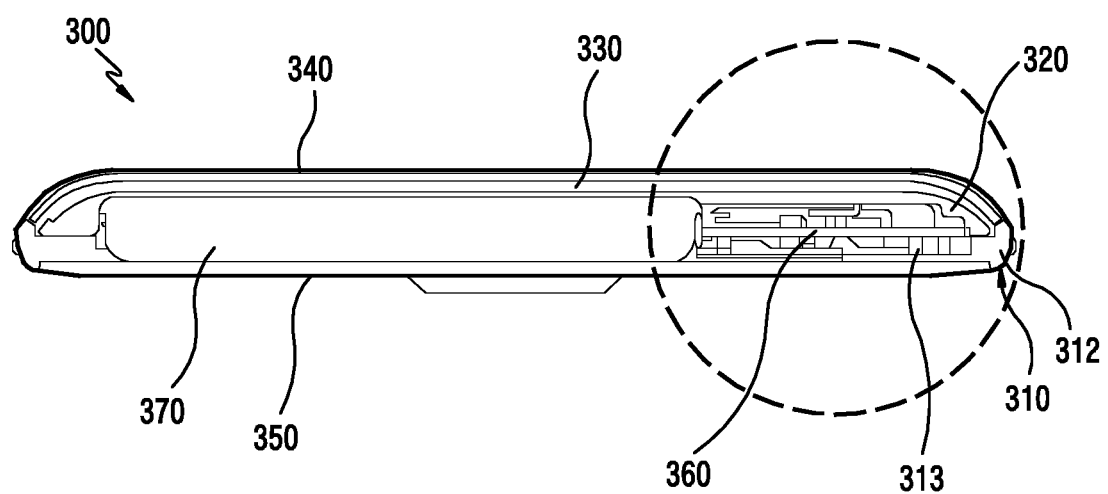
FIG. 4A is a cross-sectional view of an electronic device in an assembled state, according to an embodiment of the present disclosure.
Figure 4B:
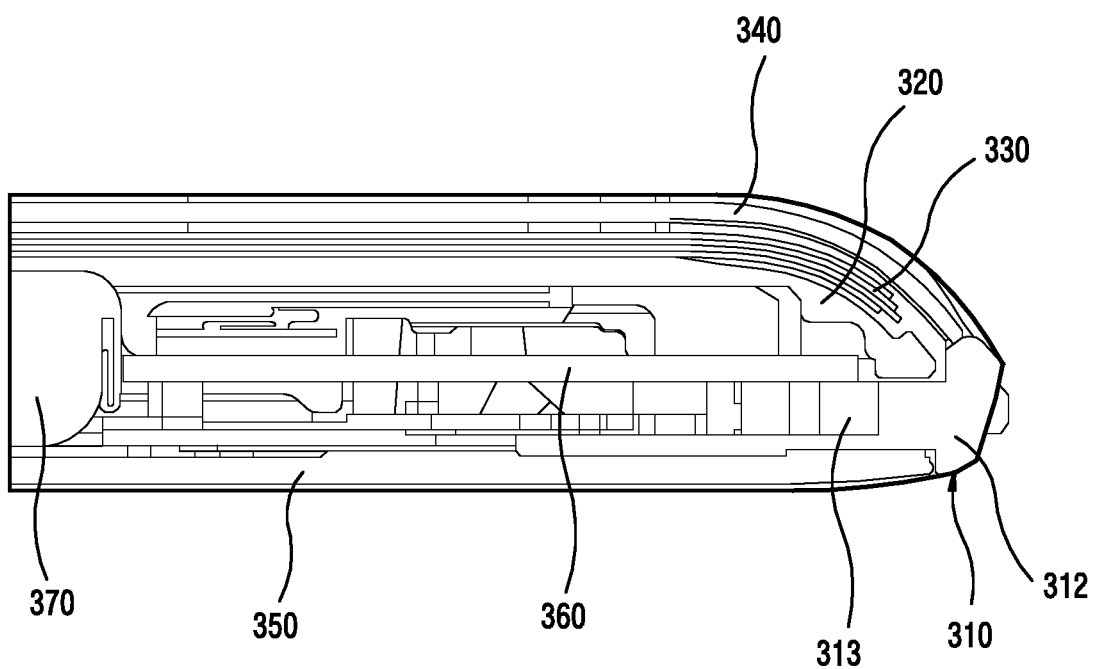
FIG. 4B is a cross-sectional view of a principal portion of an electronic device in an assembled state, according to an embodiment of the present disclosure.

FIG. 4A is a cross-sectional view of an electronic device in an assembled state, according to an embodiment of the present disclosure. FIG. 4B is a cross-sectional view of a principal portion an electronic device in an assembled state, according to an embodiment of the present disclosure.

Referring to FIGS. 4A and 4B, a cross-sectional view of the electronic device 300 is provided. As shown, the bracket 320 is fixed to the housing 310 of the electronic device 300. The housing 310 may be formed by injection-molding a non-metal member (e.g., polycarbonate (PC)) 313 to the metal bezel 312. The display module 330 is fixed to the front surface of the bracket 320, and the front window 340 is disposed on the display module 330. The front window 340 is fixed by being attached to the bracket 320 by the first adhesive member 391 adjacent to an end of the housing 310 to correspond to the shape thereof on the end of the housing 310. The front window 340 is fixed by being attached to the bracket 320 by the first adhesive member 391 while being supported by the end of the housing 310. The front window 340 has a uniform thickness and is formed in a shape having a certain curvature. All of the planar portion 3401 and the left and right bent portions 3402 and 3403 of the front window 340 are formed to have a certain thickness.

The rear window 350 is also fixed to the housing 310 by the second adhesive member 392. The rear window 350 is formed to have a thickness that is reduced towards the left and right edges (a shape which is formed in the 2.5D type).

In the space between the bracket 320 and the housing 310, the PCB 360 is accommodated, and the battery pack 370 is disposed in parallel with the PCB 360 to avoid the PCB 360.

Figure 5:
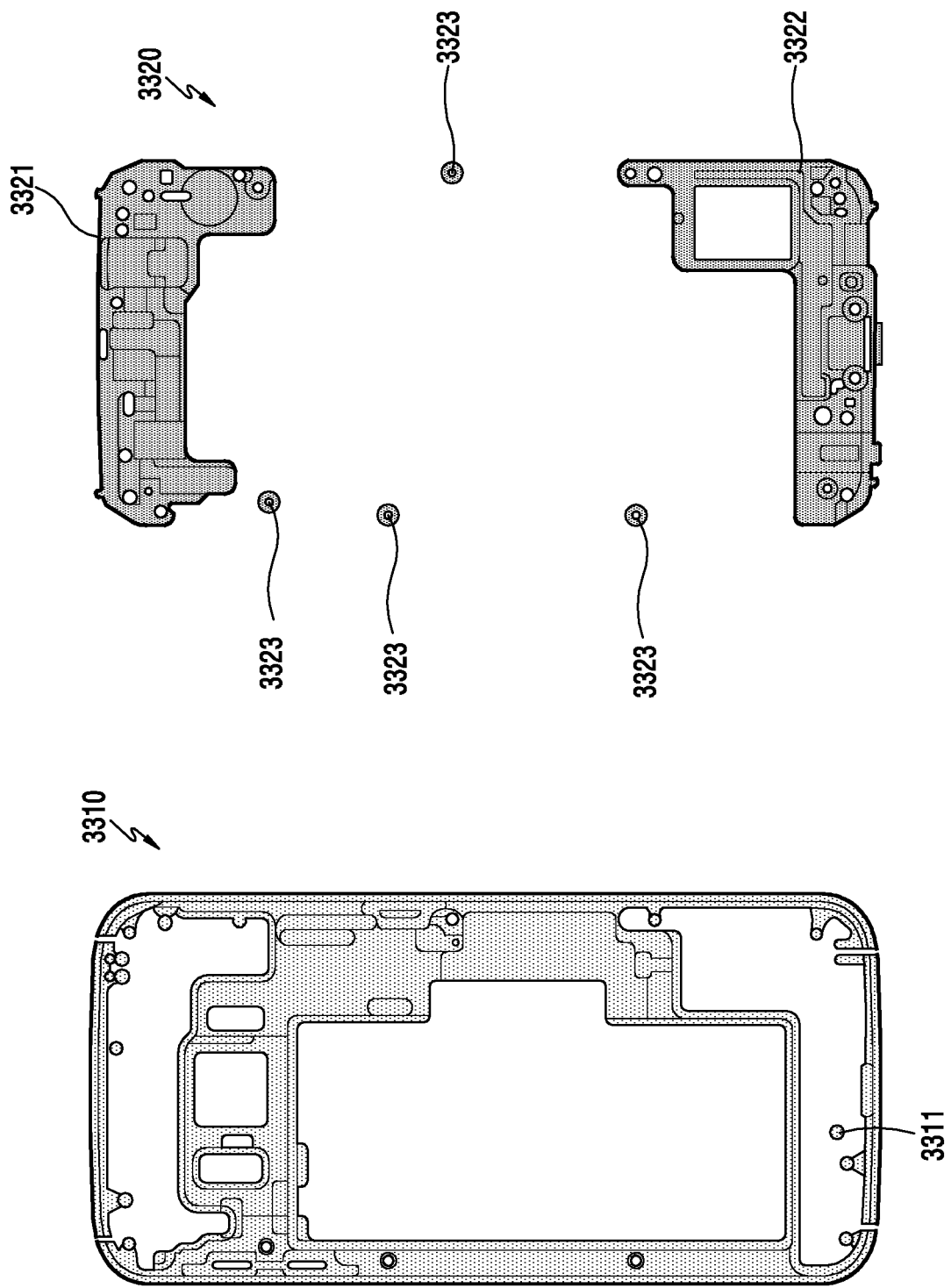
FIG. 5 illustrates views of a metal member and a non-metal member, which are applied to a housing of an electronic device, according to an embodiment of the present disclosure.

FIG. 5 illustrates a metal member and a non-metal member which are applied to a housing of an electronic device, according to an embodiment of the present disclosure.

Referring to FIG. 5, the housing 310 is provided. The housing 310 includes a metal member 3310 and a non-metal member 3320 that is insert-molded to the metal member 3310. The metal member 3310 includes the metal bezel 220, as shown in FIGS. 2A and 2B. The metal member 3310 includes a metal structure that extends to at least a part of the front surface and/or the rear surface of the electronic device 300 from the metal bezel 220. The metal member 3310 includes a metal filler 3311 that is independently formed in a space separate from the metal bezel 220.

The non-metal member 3320 includes an upper member 3321 and a lower member 3322. The non-metal member 3320 includes a plurality of insulation members 3323 that are applied to the metal member 3310. The insulation members 3323 contribute to the insulation between the metal member 3310 and the PCB 360 when fixing the housing 310 and the bracket 320, or fixing the PCB 360 through screws.

Figure 6A:
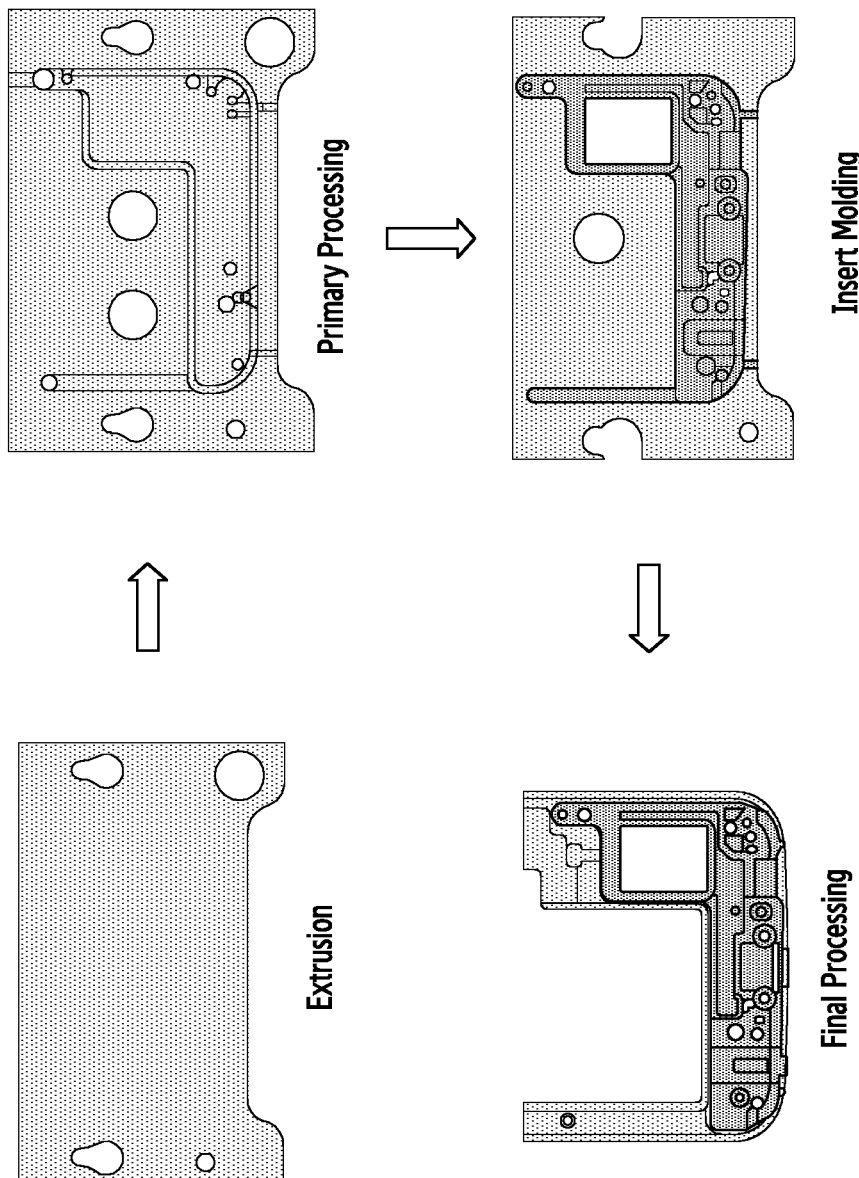
FIGS. 6A and 6B are views illustrating a process of manufacturing a housing of an electronic device, according to an embodiment of the present disclosure.
Figure 6B:
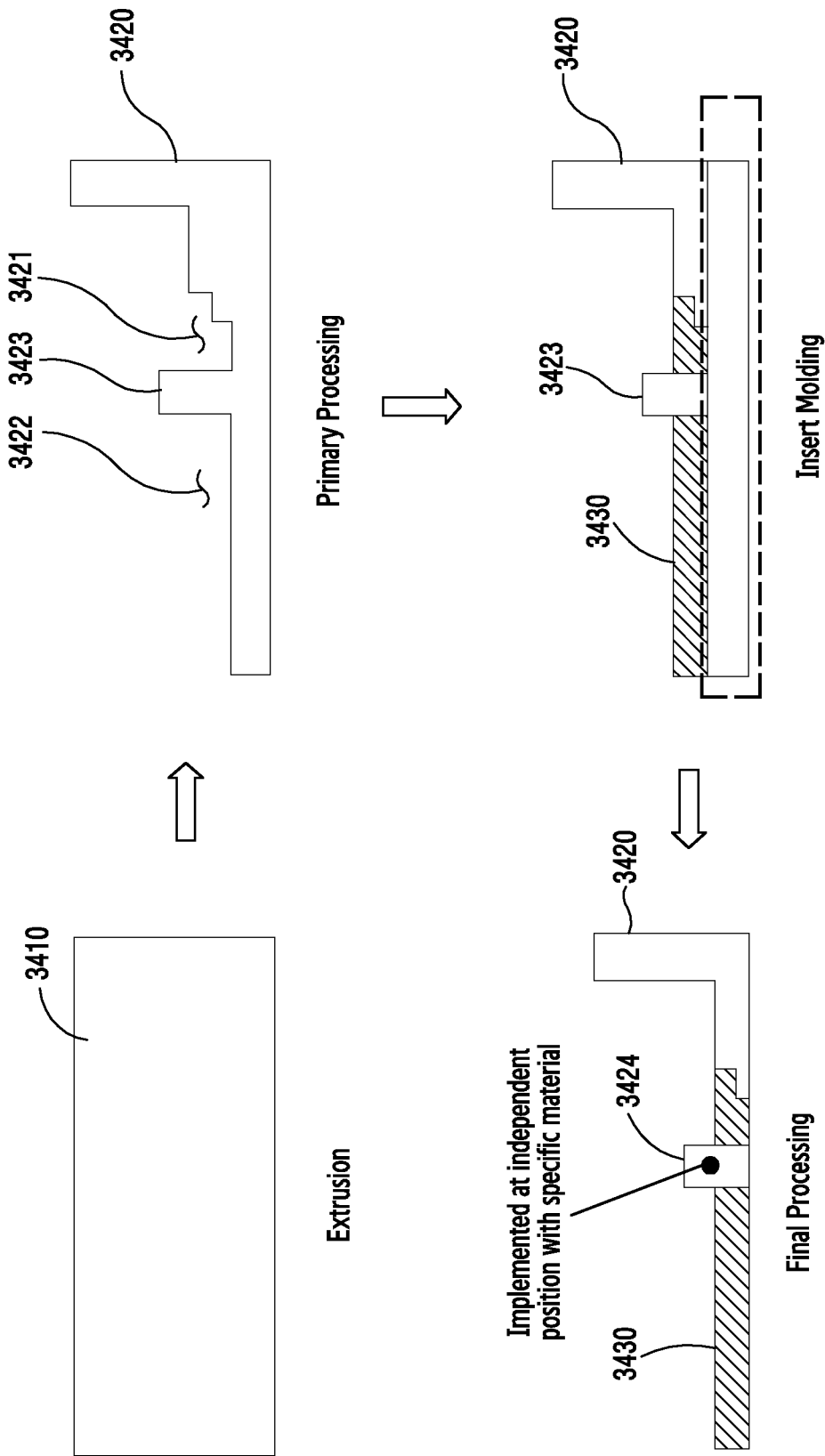
Figure 7A:
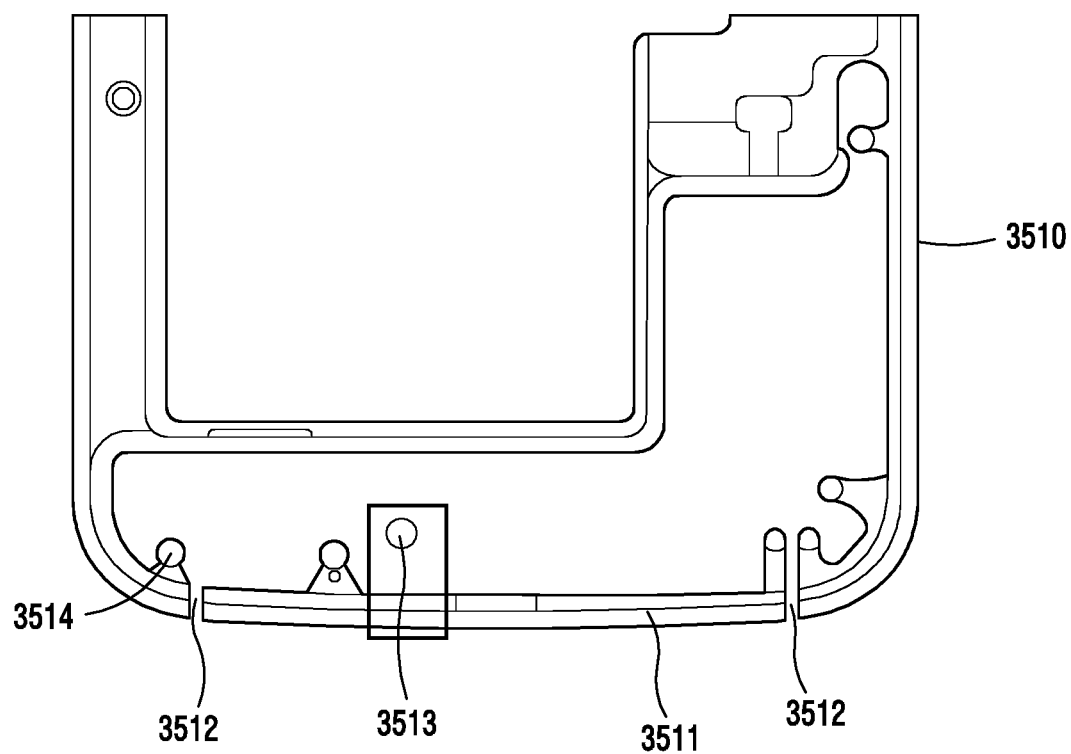
FIGS. 7A and 7B are views of a metal member and a non-metal member after a final manufacturing process, according to an embodiment of the present disclosure.
Figure 7B:
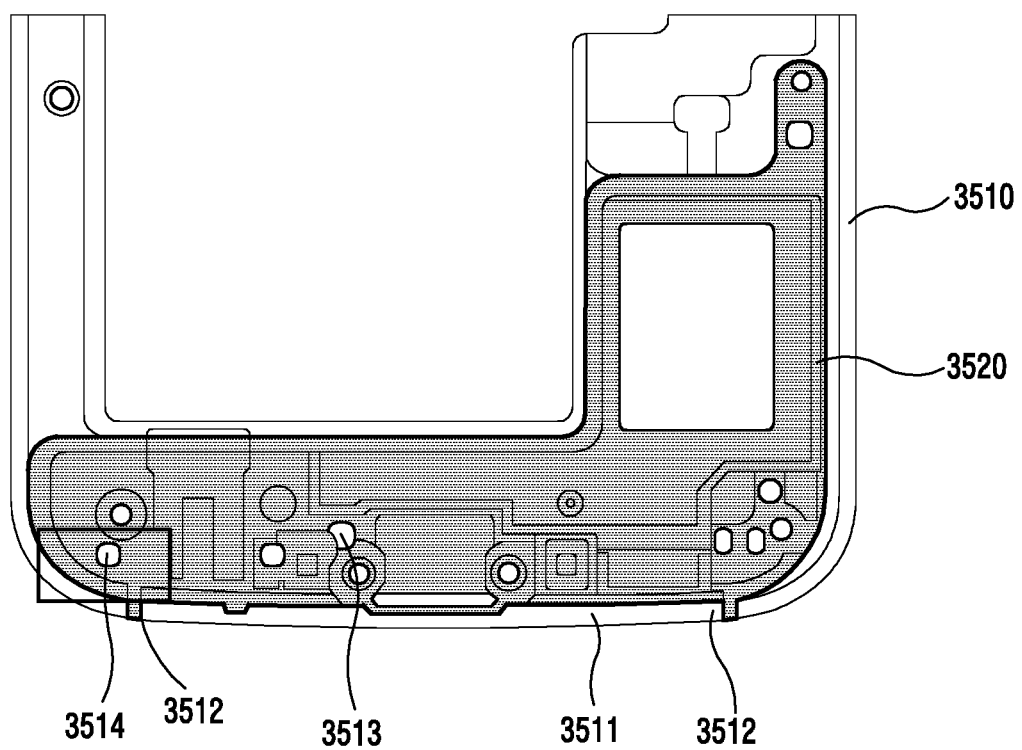

FIGS. 6A and 6B are views illustrating a process of manufacturing a housing of an electronic device, according to an embodiment of the present disclosure. FIGS. 7A and 7B are views of a metal member and a non-metal member after a final manufacturing process, according to an embodiment of the present disclosure.

Referring to FIG. 6A, a primary processing is performed by extruding a plate-type metal base material, and a non-metal member 3320 is insert-molded to the primarily processed metal base material, i.e. the metal member 3310. After the non-metal member 3320 is insert-molded to the metal member 3310, a final processing is performed.

Referring to FIG. 6B, a primarily processed base material 3420 is obtained by extruding a plate-type metal base material 3410. The primarily processed base material 3420 includes a protruding portion 3423 and a plurality of recessed portions 3421 and 3422 that are formed to be relatively lower that the protruding portion 3423. A non-metal member 3430 is insert-molded to at least a part of the plurality of recessed portions 3421 and 3422 and the protruding portion 3423 of the primarily processed metal base material 3420. When a portion, indicated by a dotted line, in the insert-molded base material is processed, the protruding portion 3424 serves as a metal filler that is disposed independently from the primarily processed base material 3420.

FIGS. 7A and 7B are views of a metal and a non-metal member after a final manufacturing process, according to an embodiment of the present disclosure.

Referring to FIG. 7A, a metal member 3510 is illustrated after the insert-molding and the final processing of a non-metal member 3520 have been completed. Referring to FIG.

7B, the non-metal member 3520 (e.g., PC) is illustrated insert-molded to the metal bezel 3510. A metal bezel 3510 and a unit bezel portion 3511, which is formed by a part of the metal bezel 3510 and cut-off portions 3512 and serves as an antenna radiator.

Referring to FIGS. 7A and 7B, the metal bezel 3510 is disposed to surround the outer periphery of the electronic device 300, and one pair of cut-off portions 3512 are formed at a certain interval at the lower side of the metal bezel 3510. By insert-molding the non-metal member 3520 to the cut-off portions 3512, the unit bezel portion 3511 is formed independently from the metal bezel 3510. The unit bezel portion 3511 may serve as an antenna member. A part of the unit bezel portion 3511 forms a contact portion 3514 that is drawn out to extend to the inside of the electronic device 300. By being formed independently from the metal bezel 3510 and the unit bezel portion 3511, a metal filler 3513 is operated as a metal island to be used as an electric connection member in the vertical direction between a DPA, which is disposed in the housing 310, and a PCB 360 that is disposed inside the electronic device 300.

Figure 8A:
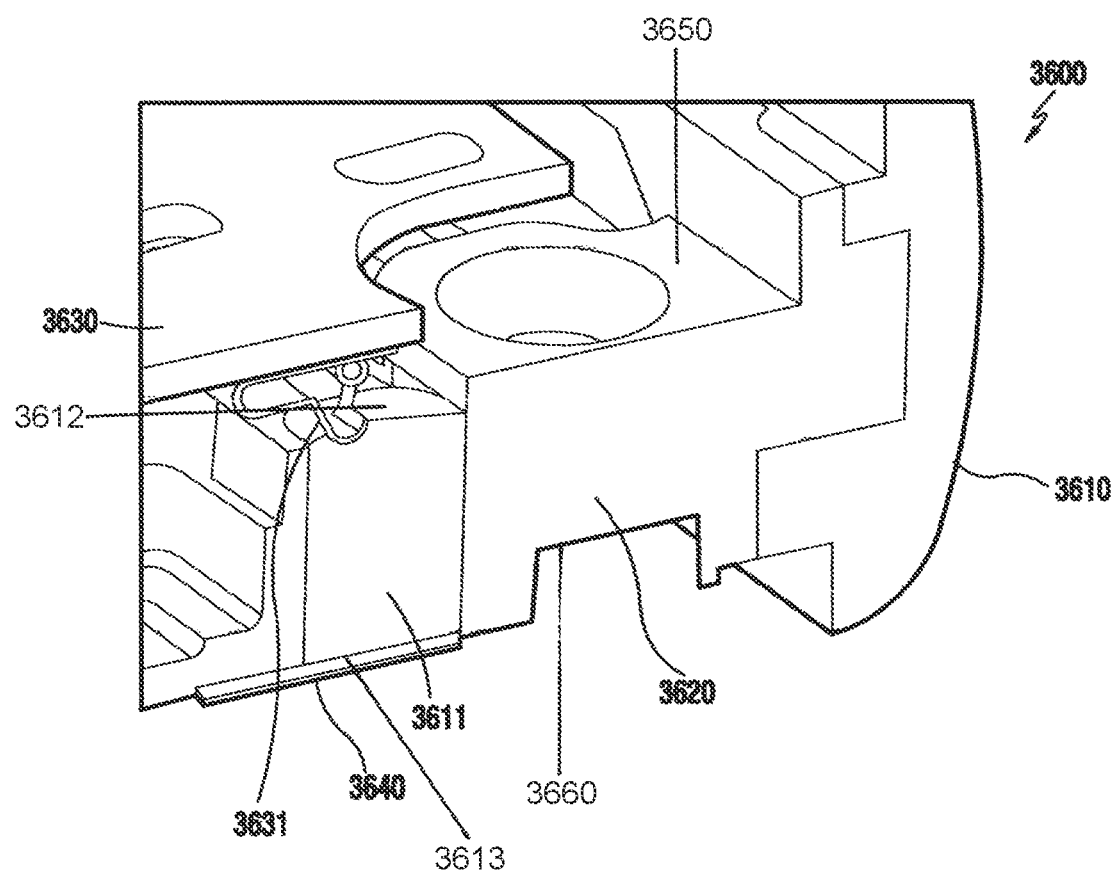
FIGS. 8A and 8B are views of a housing a state in which a metal filler is used as an electric connection member of an antenna device, according to an embodiment of the present disclosure.
Figure 8B:
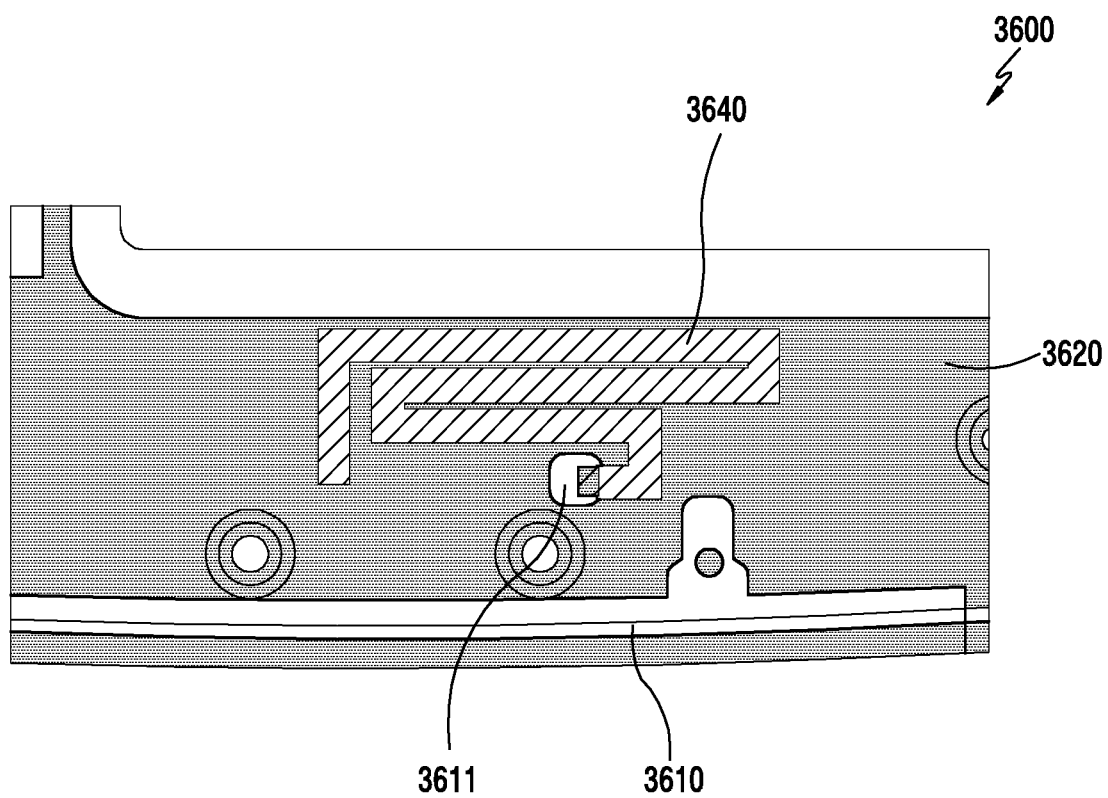

FIGS. 8A and 8B are views of a housing in a state in which a metal filler is used as an electric connection member of an antenna device, according to an embodiment of the present disclosure.

Referring to FIGS. 8A and 8B, a metal filler 3611 is disposed to be isolated by a non-metal member 3620 that is insert-molded to a metal member 3610 that is used as the metal bezel 3510. The metal member 3610 and the non-metal member 3620 contribute to at least a part of the housing 3600 of the electronic device 300. At least a part of the metal filler 3611 may be exposed to an outer surface of the non-metal member 3620. Alternatively, at least a part of the metal filler 3610 may be exposed to an inner surface of the non-metal member 3620. The non-metal member 3620 includes a first surface 3650 facing the front cover and a second surface 3660 facing the rear cover, and the metal filler 3611 includes a first end portion 3612 adjacent to the first surface 3650 and a second end portion 3613 adjacent to the second surface 3660.

An antenna radiator 3640 is disposed on and attached to the outer surface of the housing 3600. Without being limited thereto, however, the antenna radiator 3640 may be formed on the outer surface of the housing 3600 by an LDS or DPA method. The antenna radiator 3640 is physically in contact with the metal filler 3611 exposed to the outer surface of the housing 3600. A PCB 3630 is disposed within the electronic device 300, and an electric connection member 3631 is interposed between the PCB 3630 and the metal filler 3611. Various members, such as a C-clip, a thin wire cable, and a flexible printed circuit, may be used as the electric connection member 3631.

The antenna radiator (DPA) 3640, attached to the outer surface of the housing 3600, is electrically connected to the PCB 3630 through the metal filler 3611 and the electric connection member 3631, so that the antenna radiator 3640 may be used as an additional antenna radiator of the electronic device or an independent antenna radiator.

Figure 9:
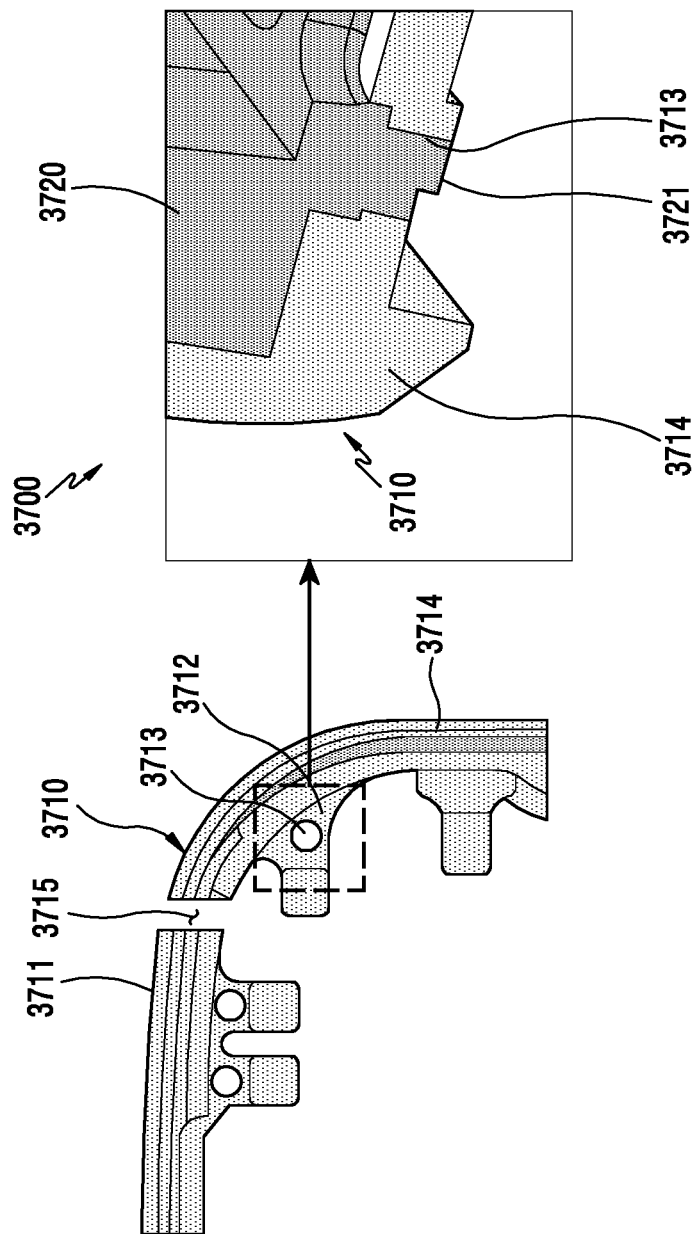
FIG. 9 is a view of a principal portion of a housing in a state where a non-metal member is insert-molded to a metal member, according to an embodiment of the present disclosure.

FIG. 9 is a view of a principal portion of a housing in a state where a non-metal member is insert-molded to a metal member, according to an embodiment of the present disclosure.

Referring to FIG. 9, in a housing 3700, the non-metal member 3270 is formed on a metal member 3170 by insert-molding. Because the metal member 3710 and the non-metal member 3720 are bonded to each other through bonding between dissimilar materials, the metal member 3710 and the non-metal member 3720 preferably have a separate and additional binding structure. The metal member 3710 includes a metal bezel 3714 and a unit bezel 3711 that is separated from the metal bezel 3714 by cut-off portions 3715. The metal bezel 3714 includes a flange 3712 that is formed to extend inwardly, and at least one molding opening 3713 is formed in the flange 3712. Accordingly, when the non-metal member 3720 is insert-molded to the metal member 3710, the non-metal member 3720 may be insert-molded to the molding opening 3713 of the metal member 3710 to serve as a non-metal filler 3721, which supports the binding force between the metal member 3710 and the non-metal member 3720 which are dissimilar materials.

Figure 10A:
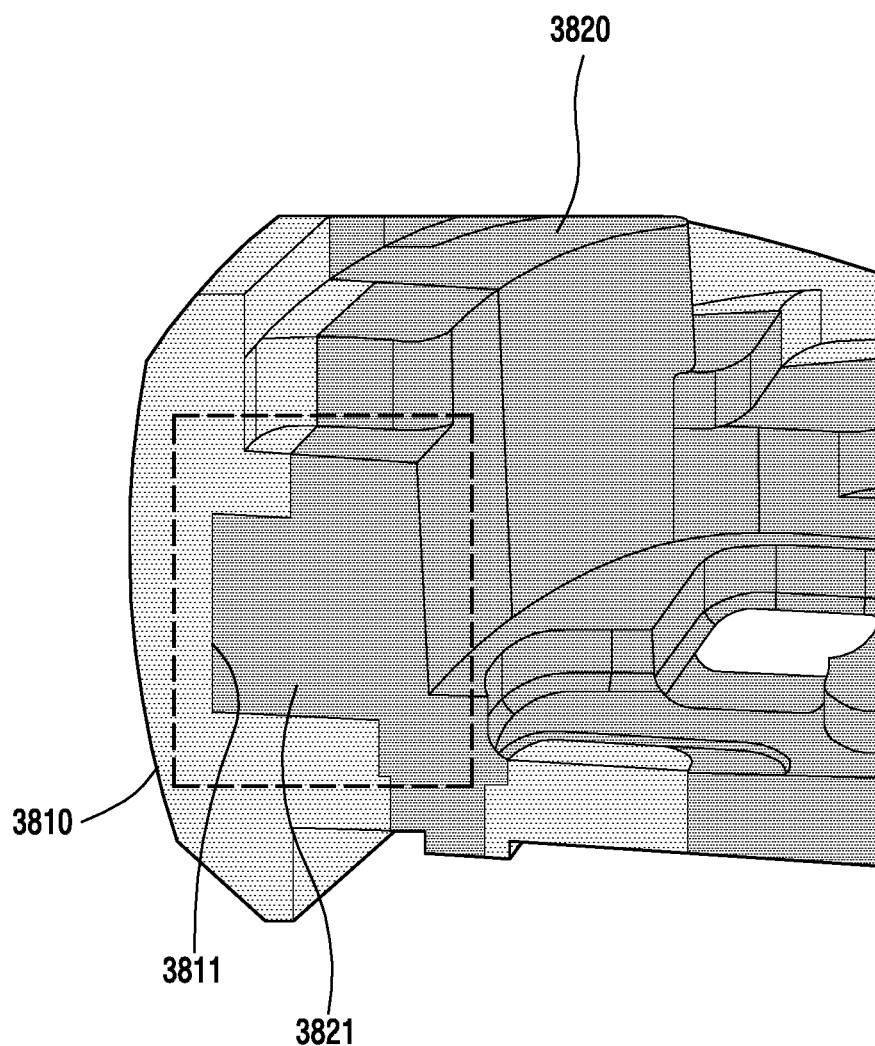
FIGS. 10A to 10C are views of various configurations of a housing in a state in which a non-metal member is insert-molded to a metal member, according to an embodiment of the present disclosure.
Figure 10B:
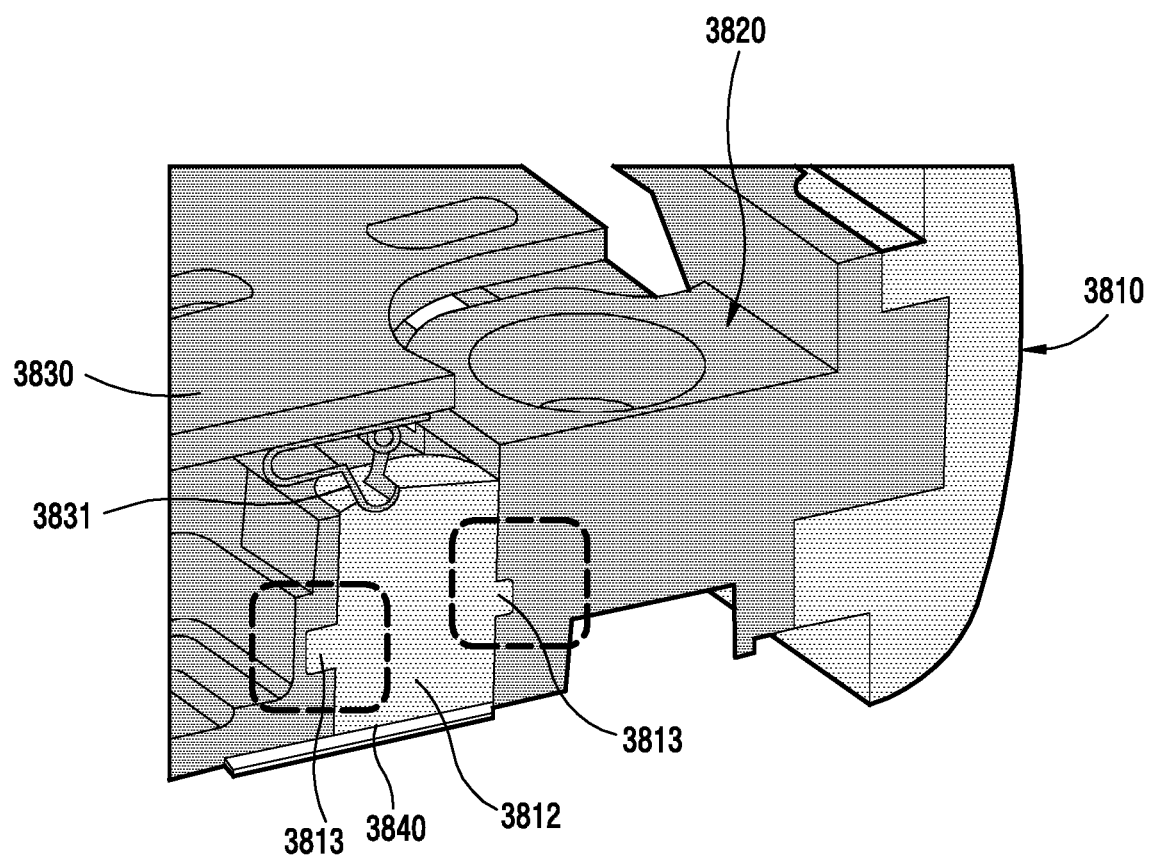
Figure 10C:
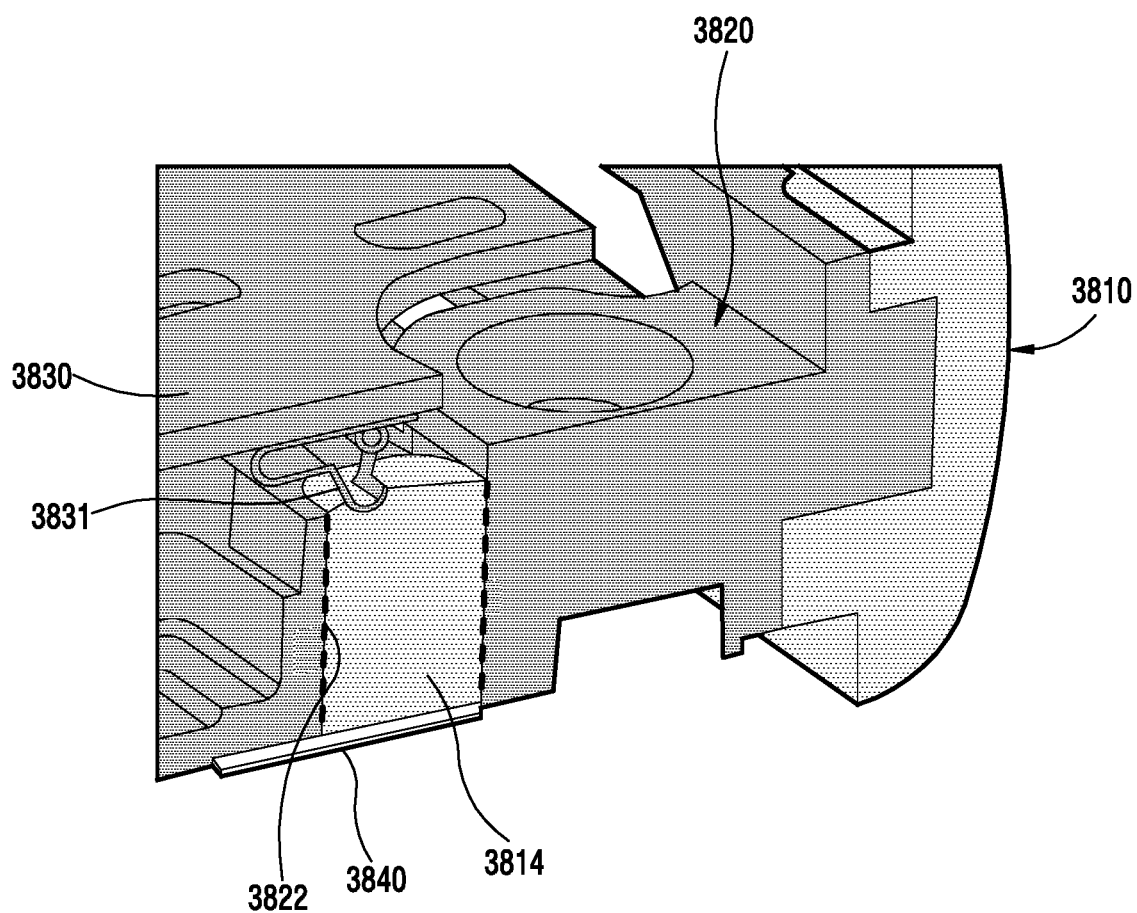

FIGS. 10A to 10C are views of various configurations of a housing in a state in which a non-metal member is insert-molded to a metal member, according to an embodiment of the present disclosure.

Referring to FIGS. 10A to 10C a bonding structure for improving the adhesive force between dissimilar materials (a metal material and a non-metal material) by the structure of the metal member itself is illustrated.

Referring to FIG. 10A, a recess 3811 is formed on a metal member 3810, and a non-metal member 3820 is insert-molded to the recess 3811 to be formed as a protrusion 3821 so as to support the bonding force between dissimilar materials.

Referring to FIG. 10B, the metal member 3810 and the non-metal member 3820 are insert-molded, and a metal filler 3812, which is disposed to be spaced apart from the metal member 3810, causes a plurality of protrusions 3813 along an outer peripheral surface thereof to be molded as non-metal members. Accordingly, it is possible to prevent in advance the metal filler 3812 from being separated or moved in the vertical direction by a pressing force of an electric connection member 3831, which is installed on the PCB 3830 and has a certain elasticity.

Referring to FIG. 10C, the metal member 3810 and the non-metal member 3820 are insert-molded, and a metal filler 3814, which is disposed to be spaced apart from the metal member 3810, is also processed by performing a process, such as sanding or chemical etching, on an outer surface of the metal filler 3814 during the extrusion process. Thus, the surface frictional force is increased so that the bonding force of the metal filler 3814 with the non-metal 3820 is increased. Accordingly, it is possible to prevent in advance the metal filler 3821 from being separated or moved in the vertical direction by the pressing force of the electric connection member 3831, which is installed on the PCB 3830 and has a certain elasticity.

Figure 11A:
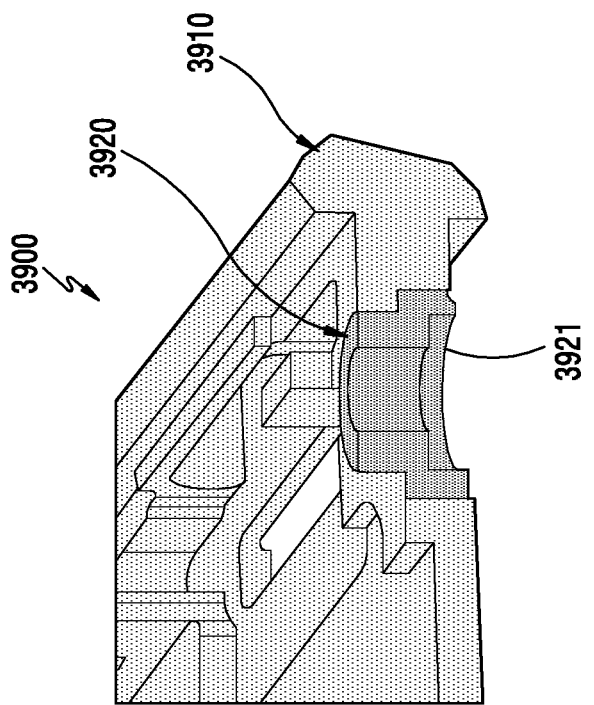
FIGS. 11A and 11B are views of a housing in a state where a non-metal member is used as an insulation member in a metal member, according to an embodiment of the present disclosure.
Figure 11A:
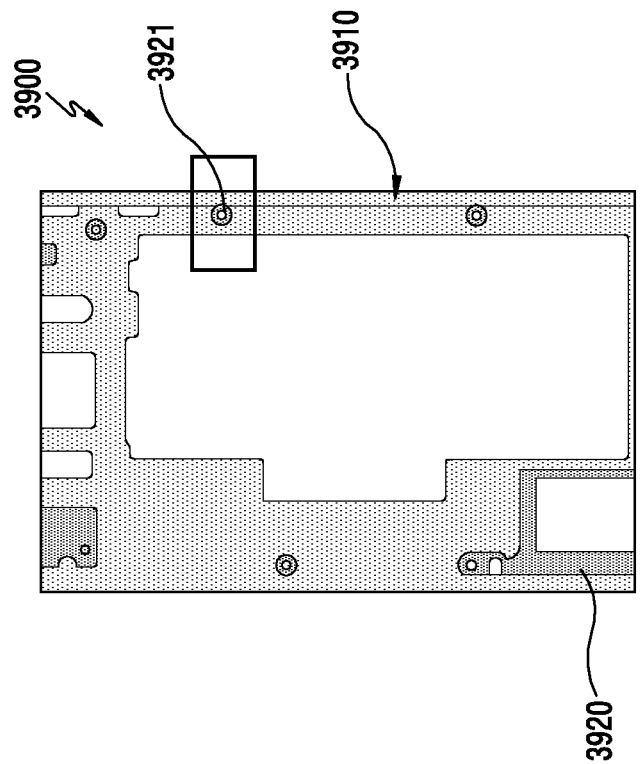
Figure 11B:
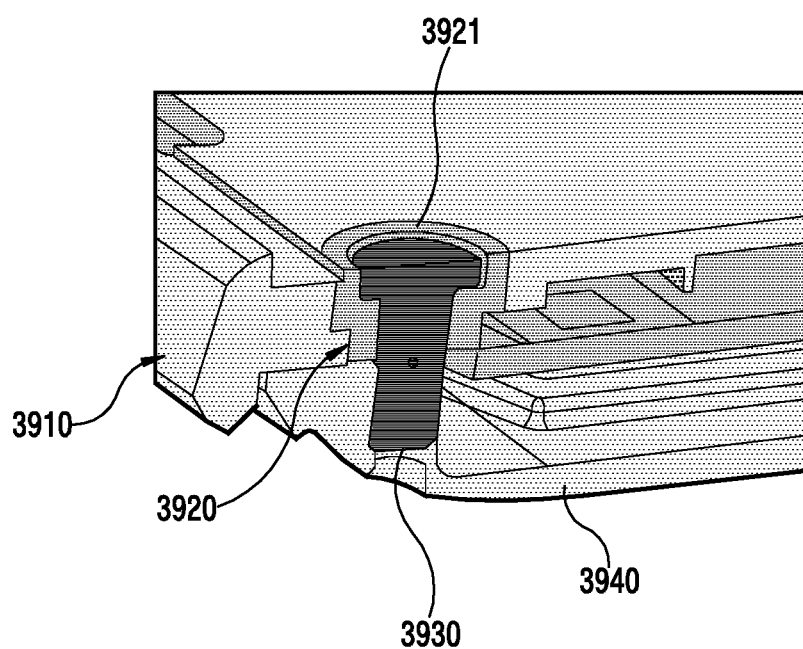

FIGS. 11A and 11B are views of a housing in a state where a non-metal member is used as an insulation member in a metal member, according to an embodiment of the present disclosure.

Referring to FIGS. 11A and 11B, a housing 3900 is formed by insert-molding a non-metal member 3920 to a metal member 3910. On the metal member 3910, one or more insulation members 3921 by the non-metal member 3920 are disposed. Each insulation member 3921 accommodates a screw 3930, and is configured to prevent in advance an electric shock accident that is caused by electric power applied to the metal member 3910 through a structure 3940 (e.g., a PCB) within the electronic device 300.

The insulation member 3921, which is insert-molded in the metal member 3910, is formed in a hollow shape to have a depth that is at least the same as the entire height of the metal member 3910. The screw 3930 inserted into the insulation member 3921 is fastened to the structure 3940 of the electronic device. The structure 3940 may be a PCB, a bracket, etc. Accordingly, the metal member 3910 is maintained in the state in which it is completely insulated from the structure 3940 within the electronic device 300 by the insulation member 3921, so that an electric shock accident can be prevented in advance.

According to various embodiments, a housing is capable of directly connecting a metal member and an antenna radiator to each other so that an additional mounting space on a PCB may not be required, and various connection conditions are enabled depending on a portion of an external exposed face of the metal member without requiring a separate component so that an error and a deviation caused by an additional process may be excluded.

While the present disclosure has been particularly shown and described with reference to the examples provided herein, it will be understood by those skilled in the art that various changes in form and details may be made therein without departing from the spirit and scope of the present disclosure as defined by the appended claims and their equivalents.

What is claimed is:

1. A portable communication device, comprising:
   a front cover forming a front face of the portable communication device;
   a rear cover forming a rear face of the portable communication device;
   a bezel surrounding a space formed by the front cover and the rear cover, the bezel being disposed along an outer periphery of the portable communication device and being a separate element from the front cover and the rear cover;
   a metal structure extending from at least one portion of the bezel to the space;
   a non-metal structure positioned within the space and partially overlapping the metal structure, the non-metal structure including a first surface facing the front cover and a second surface facing the rear cover;
   a metal filler disposed between the first surface to the second surface of the non-metal structure through a portion of the non-metal structure and including a first end portion adjacent to the first surface and a second end portion adjacent to the second surface, and
   the metal filler being formed of a metallic material having a material that is identical to a material of the bezel,
   a first electronic component disposed on the first surface within the space and electrically connected to the first end portion;
   a second electronic component disposed on the second surface within the space and electrically connected to the second end portion, and
   a plurality of protrusions disposed along an outer peripheral surface of the metal filler and molded as non-metal members,
   wherein each of the plurality of protrusions is substantially perpendicular to the outer peripheral surface of the metal filler, and
   wherein the first electronic component and the second electronic component are connected to each other through the metal filler.

2. The portable communication device of claim 1, further comprising:
   a flexible conductive structure forming an electrical connection with the first end portion.

3. The portable communication device of claim 2, further comprising:
   a printed circuit board (PCB) disposed within the space and being arranged to be electrically in contact with the flexible conductive structure.

4. The portable communication device of claim 3, wherein the plurality of protrusions is non-threaded and are inserted into corresponding recesses of the PCB.

5. The portable communication device of claim 1, wherein the front cover is formed of glass.

6. The portable communication device of claim 3, wherein the PCB is positioned between the front cover and the non-metal structure, and
   wherein the flexible conductive structure is positioned between the PCB and the first end portion of the metal filler.

7. A portable communication device, comprising:
   a front cover forming a front face of the portable communication device;
   a rear cover forming a rear face of the portable communication device;
   a bezel surrounding a space formed by the front cover and the rear cover, the bezel being disposed along an outer periphery of the portable communication device and being a separate element from the front cover and the rear cover;
   a metal structure extending from the bezel to the space, at least a portion of the metal structure being integrally formed with the bezel;
   a non-metal structure positioned within the space and partially overlapping with the metal structure, the non-metal structure including a first surface facing the front cover and a second surface facing the rear cover;
   a metal filler disposed between the first surface to the second surface of the non-metal structure through a portion of the non-metal structure and including a first end portion adjacent to the first surface and a second end portion adjacent to the second surface;
   a plurality of protrusions disposed along an outer peripheral surface of the metal filler and molded as non-metal members,
   a first electronic component disposed on the first surface within the space and electrically connected to the first end portion; and
   a second electronic component disposed on the second surface within the space and electrically connected to the second end portion,
   wherein each of the plurality of protrusions is substantially perpendicular to the outer peripheral surface of the metal filler, and
   wherein the first electronic component and the second electronic component are connected to each other through the metal filler.

8. The portable communication device of claim 7, further comprising:
   a flexible conductive structure forming an electrical connection with the first end portion.

9. The portable communication device of claim 8, further comprising:
   a printed circuit board (PCB) disposed within the space and being arranged to be electrically in contact with the flexible conductive structure.

10. The portable communication device of claim 9, wherein the plurality of protrusions is non-threaded and are inserted into corresponding recesses of the PCB.

11. The portable communication device of claim 7, wherein the front cover is formed of glass.

12. The portable communication device of claim 9,
wherein the PCB is positioned between the front cover and the non-metal structure, and
wherein the flexible conductive structure is positioned between the PCB and the first end portion of the metal filler.

13. A portable communication device comprising:
a front cover forming a front face of the portable communication device;
a rear cover forming a rear face of the portable communication device;
a bezel surrounding a space formed by the front cover and the rear cover, the bezel being disposed only along an outer periphery of the portable communication device and being a separate element from the front cover and the rear cover;
a display device embedded in the space and including a screen region that is exposed through the front cover;
a metal structure extending from the bezel to the space, at least a portion of the metal structure being integrally formed with the bezel;
a non-metal structure positioned within the space and partially overlapping the metal structure, the non-metal structure including a first surface facing the front cover and a second surface facing the rear cover;
a metal filler disposed between the first surface to the second surface of the non-metal structure through a portion of the non-metal structure, the metal filler including a first end portion adjacent to the first surface and a second end portion adjacent to the second surface;
a plurality of protrusions disposed along an outer peripheral surface of the metal filler and molded as non-metal members;
a first electronic component disposed on the first surface within the space and electrically connected to the first end portion; and
a second electronic component disposed on the second surface within the space and electrically connected to the second end portion,
wherein each of the plurality of protrusions is substantially perpendicular to the outer peripheral surface of the metal filler,
wherein the metal filler is formed of a material identical to a material of the bezel, and
wherein the first electronic component and the second electronic component are connected to each other through the metal filler.

* * * * *